(12) United States Patent
Ye

(10) Patent No.: US 12,241,954 B2
(45) Date of Patent: Mar. 4, 2025

(54) SYSTEMS AND METHODS FOR QUANTITATIVE MEASUREMENT IN MAGNETIC RESONANCE IMAGING

(71) Applicant: UNITED IMAGING HEALTHCARE NORTH AMERICA, INC., Houston, TX (US)

(72) Inventor: Yongquan Ye, Houston, TX (US)

(73) Assignee: UNITED IMAGING HEALTHCARE NORTH AMERICA, INC., Houston, TX (US)

( * ) Notice: Subject to any disclaimer, the term of this patent is extended or adjusted under 35 U.S.C. 154(b) by 44 days.

(21) Appl. No.: 18/300,827

(22) Filed: Apr. 14, 2023

(65) Prior Publication Data

US 2024/0353515 A1  Oct. 24, 2024

(51) Int. Cl.
*G01R 33/56* (2006.01)
*G01R 33/50* (2006.01)

(52) U.S. Cl.
CPC .......... *G01R 33/50* (2013.01); *G01R 33/5608* (2013.01)

(58) Field of Classification Search
CPC .............................. G01R 33/50; G01R 33/5608
See application file for complete search history.

(56) References Cited

U.S. PATENT DOCUMENTS

| | | | |
|---|---|---|---|
| 6,388,441 B1 | 5/2002 | Chen | |
| 8,422,767 B2 * | 4/2013 | Ligeti | H04N 7/0125 382/128 |
| 2006/0206105 A1 * | 9/2006 | Chopra | A61N 7/02 607/96 |
| 2008/0033297 A1 * | 2/2008 | Sliwa | A61B 8/0816 600/439 |
| 2010/0086184 A1 | 4/2010 | Krüger et al. | |
| 2011/0105884 A1 | 5/2011 | Beck | |
| 2018/0081004 A1 | 3/2018 | Yang | |
| 2018/0143272 A1 | 5/2018 | Liu | |
| 2018/0256042 A1 * | 9/2018 | Beckers | A61B 5/0013 |
| 2018/0338701 A1 | 11/2018 | Amemiya et al. | |

(Continued)

OTHER PUBLICATIONS

Ye, Yongquan et al., A Mulli-Dimensional Integration (MDI) Strategy for MR T2* mapping, NMR in Biomedicine, 1-13, 2021.

(Continued)

*Primary Examiner* — Christopher P McAndrew
*Assistant Examiner* — Zannatul Ferdous
(74) *Attorney, Agent, or Firm* — Metis IP LLC

(57) ABSTRACT

A method and system for MRI may be provided. A plurality of signals of a subject generated using an MRI device may be acquired. Each signal may correspond to a set of values in a plurality of signal dimensions of signal acquisition. A primary signal dimension associated with a signal representation of the subject among the plurality of signal dimensions may be determined. A first value and a second value relating to the signal representation may be determined based on the plurality of signals. The first value may represent the signal representation along a first direction of the primary signal dimension, the second value may represent the signal representation along a second direction of the primary signal dimension, and the first direction may be opposite to the second direction. A value of a quantitative parameter of the subject may be determined based on the first value and the second value.

19 Claims, 9 Drawing Sheets

(56) References Cited

U.S. PATENT DOCUMENTS

2020/0090382 A1 3/2020 Huang et al.
2020/0303049 A1 9/2020 Zhang et al.

OTHER PUBLICATIONS

Ye, Yongquan et al., Multi-Parametric MR Imaging with Flexible Design (Multiplex), Magnetic Resonance in Medicine, 1-16, 2021.
Sebastian Bidhult et al., Validation of a New T2* Algorithm and Its Uncertainty Value for Cardiac and Liver Iron Load Determination from MRI Magnitude Images, Magnetic Resonance in Medicine, 75: 1717-1729, 2016.
Tobias Hesper et al., T2* Mapping for Articular Cartilage Assessment: Principles, Current Applications, and Future Prospects. Skeletal Radiol, 2014, 17 pages.
Wu, Bing et al., Fast and Tissue-Optimized Mapping of Magnetic Susceptibility and T2* with Multi-Echo and multi-Shot Spirals, Neuroimage, 59: 297-305, 2012.

* cited by examiner

500

- Determining, among the plurality of signal dimensions, at least one secondary signal dimension — 510
- For each of at least one value in the at least one secondary signal dimension, determining, based on a portion of the plurality of signals that correspond to the value of the at least one secondary signal dimension, at least one preliminary value of the signal representation along the first direction of the primary signal dimension — 520
- Determining, based on at least a portion of the at least one preliminary value of the signal representation, the first value of the signal representation — 530

- Determining, among the plurality of signal dimensions, at least one secondary signal dimension — 610
- Obtaining an optimization function of the signal representation, the optimization function incorporating the primary signal dimension along the first direction and the at least one secondary signal dimension — 620
- Determining the first value of the signal representation of the subject by inputting the plurality of signals into the optimization function — 630

SYSTEMS AND METHODS FOR QUANTITATIVE MEASUREMENT IN MAGNETIC RESONANCE IMAGING

TECHNICAL FIELD

The present disclosure generally relates to magnetic resonance imaging (MRI), and more particularly, methods and systems for quantitative measurement in MRI.

BACKGROUND

MRI systems are widely used in medical diagnosis and/or treatment by exploiting a powerful magnetic field and radio frequency (RF) techniques. In an MR scan of a subject, a plurality of coil units of an MRI device may detect a plurality of echo signals representing a plurality of echoes after an MR pulse sequence is applied on the subject. In some occasions, one or more quantitative parameters, such as a longitudinal relaxation time (T1), a transverse relaxation time (T2 or T2*), a transverse relaxation rate (R2 or R2*) of the subject may be determined based on the echo signals. The quantitative parameter(s) may reflect physiological characteristics of the subject and be used in disease diagnosis. Therefore, it is desirable to develop systems and methods for performing quantitative measurement in MRI to determine the quantitative parameter(s) of the subject.

SUMMARY

According to an aspect of the present disclosure, a system for MRI may be provided. The system may include at least one storage device including a set of instructions for quantitative measurement in MRI and at least one processor in communication with the at least one storage device. When executing the set of instructions, the at least one processor may be configured to direct the system to perform one or more of the following operations. The system may acquire a plurality of signals of the subject. The plurality of signals may be generated using an MRI device, and each of the plurality of signals may correspond to a set of values in a plurality of signal dimensions of signal acquisition using the MRI device. The system may determine a primary signal dimension associated with a signal representation of the subject among the plurality of signal dimensions. The system may determine a first value and a second value relating to the signal representation of the subject based on the plurality of signals. The first value may represent the signal representation along a first direction of the primary signal dimension, the second value may represent the signal representation along a second direction of the primary signal dimension, and the first direction may be opposite to the second direction. The system may further determine a value of a quantitative parameter of the subject based on the first value and the second value.

In some embodiments, if the primary signal dimension is an echo time, the first direction may be a direction in which the time elapses, and the second direction may be a direction in which the time retrogrades.

In some embodiments, to determine a value of a quantitative parameter of the subject based on the first value and the second value, the system may determine a first preliminary value of the quantitative parameter of the subject based on the first value. The system may also determine a second preliminary value of the quantitative parameter of the subject based on the second value. The system may further determine the value of the quantitative parameter of the subject based on the first preliminary value and the second preliminary value.

In some embodiments, to determine a first preliminary value of the quantitative parameter of the subject based on the first value, the system may obtain a first relationship relating to the signal representation and the quantitative parameter along the first direction of the primary signal dimension. The system may further determine the first preliminary value of the quantitative parameter of the subject based on the first value of the signal representation and the first relationship.

In some embodiments, to determine a second preliminary value of the quantitative parameter of the subject based on the second value, the system may obtain a second relationship relating to the signal representation and the quantitative parameter along the second direction of the primary signal dimension. The system may further determine the second preliminary value of the quantitative parameter of the subject based on the second value of the signal representation and the second relationship.

In some embodiments, the system may further determine a value of a signal-noise parameter indicative of a signal level of the plurality of signals relative to a noise level of the plurality of signals based on the first value and the second value.

In some embodiments, the subject may be one of a plurality of physical points of an object, and the system may perform one or more of the following operations. The system may generate a parametric map relating to the quantitative parameter of the object based on a value of the quantitative parameter of each physical point of the object. For each of at least one reference signal representation, the system may determine a value of a first signal-noise parameter indicative of a signal level of the reference signal representation relative to a noise level of the reference signal representation. The system may determine a value of a second signal-noise parameter indicative of a signal level of the parametric map relative to a noise level of the parametric map based on the value of the first signal-noise parameter of each reference signal representation.

In some embodiments, the quantitative parameter of the subject may be a transverse relaxation time, and to determine the value of the quantitative parameter of the subject based on the first preliminary value and the second preliminary value, the system may perform the following operations. The system may determine a first reciprocal of the first preliminary value and a second reciprocal of the second preliminary value. The system may further determine the value of the transverse relaxation time based on the first reciprocal and the second reciprocal.

In some embodiments, the quantitative parameter of the subject may be a transverse relaxation rate, and the system may designate an average of the first preliminary value and the second preliminary value as the value of the transverse relaxation rate.

In some embodiments, the system may determine the first value of the signal representation of the subject by perform the following operations. The system may determine at least one secondary signal dimension among the plurality of signal dimensions. For each of at least one value in the at least one secondary signal dimension, the system may determine at least one preliminary value of the signal representation along the first direction of the primary signal dimension based on a portion of the plurality of signals that correspond to the value of the at least one secondary signal dimension. The system may determine the first value of the signal representation based on at least a portion of the at least one preliminary value of the signal representation.

In some embodiments, the system may determine the first value of the signal representation of the subject by perform the following operations. The system may determine at least one secondary signal dimension among the plurality of signal dimensions. The system may obtain an optimization function of the signal representation. The optimization function may incorporate the primary signal dimension along the first direction and the at least one secondary signal dimension. The system may further determine the first value of the signal representation of the subject by inputting the plurality of signals into the optimization function.

In some embodiments, to determine the first value of the signal representation of the subject by inputting the plurality of signals into the optimization function, for at least one value in the at least one secondary signal dimension, the system may determine at least one pair of signals corresponding to the value in the at least one secondary signal dimension among the plurality of signals. Each pair of the at least one pair of signals may correspond to different values in the primary signal dimension. The system may determine the first value of the signal representation of the subject by inputting the at least one pair of signals into the optimization function.

In some embodiments, to acquire a plurality of signals of the subject, the system may cause the MRI device to apply an MR pulse sequence on the subject. The system may detect a plurality of echo signals by at least one coil units of the MRI device. The system may determine the plurality of signals of the subject based on the plurality of echo signals.

In some embodiments, the subject may be a physical point of an object, and to determine the plurality of signals of the subject based on the plurality of echo signals, the system may reconstruct a plurality of images including image data of the physical point based on the plurality of echo signals. The system may further designate the image data corresponding to the physical point in the plurality of images as the plurality of signals of the physical point.

In some embodiments, the subject may be a physical point of an object, the signal representation may be a change of signal intensity at the physical point with an echo time, and the quantitative parameter of the physical point may include at least one of a longitudinal relaxation time, a transverse relaxation time, a transverse relaxation rate, an apparent diffusion coefficient (ADC), a field distribution, a signal-noise ratio indicator, a signal-signal ratio indicator, or a longitudinal relaxation time in a rotating frame.

In some embodiments, the primary signal dimension may be an echo time, and the quantitative parameter may be at least one of the transverse relaxation time, the transverse relaxation decay, or the field distribution. The primary signal dimension may be also a T2-preparation duration, and the quantitative parameter may be the transverse relaxation time. The primary signal dimension may be a T1ρ-preparation duration, and the quantitative parameter may be the longitudinal relaxation time in a rotating frame. The primary signal dimension may be also an inversion time, and the quantitative parameter may be the longitudinal relaxation time. The primary signal dimension may be also a b-value, and the quantitative parameter may be the ADC.

In some embodiments, the signal representation may be represented by a complex number including a phase component and an amplitude component, and the value of the quantitative parameter may be determined based on at least one of the phase component or the amplitude component of the complex number. The signal representation may be also represented by a real number, and the value of the quantitative parameter may be determined based on the real number.

In some embodiments, the plurality of signal dimensions may include at least two of an echo time (TE), an unit repetition time (TR), an inversion recovery time (TI), a b-value, a T1ρ-preparation duration, a T2-preparation duration, a repetition, a velocity encoding value, a count of radio frequency (RF) channels, a flip angle, an RF center frequency, or a RF receiving coil unit.

According to another aspect of the present disclosure, a method for MRI may be provided. The method may include acquiring a plurality of signals of the subject. The plurality of signals may be generated using an MRI device, and each of the plurality of signals may correspond to a set of values in a plurality of signal dimensions of signal acquisition using the MRI device. The method may also include determining a primary signal dimension associated with a signal representation of the subject among the plurality of signal dimensions. The method may further include determining a first value and a second value relating to the signal representation of the subject based on the plurality of signals. The first value may represent the signal representation along a first direction of the primary signal dimension, the second value may represent the signal representation along a second direction of the primary signal dimension, and the first direction may be opposite to the second direction. The method may further include determining a value of a quantitative parameter of the subject based on the first value and the second value.

According to yet another aspect of the present disclosure, a non-transitory computer readable medium may be provided. The non-transitory computer readable medium may comprise at least one set of instructions for MRI. When executed by one or more processors of a computing device, the at least one set of instructions causes the computing device to perform a method. The method may include acquiring a plurality of signals of the subject. The plurality of signals may be generated using an MRI device, and each of the plurality of signals may correspond to a set of values in a plurality of signal dimensions of signal acquisition using the MRI device. The method may also include determining a primary signal dimension associated with a signal representation of the subject among the plurality of signal dimensions. The method may further include determining a first value and a second value relating to the signal representation of the subject based on the plurality of signals. The first value may represent the signal representation along a first direction of the primary signal dimension, the second value may represent the signal representation along a second direction of the primary signal dimension, and the first direction may be opposite to the second direction. The method may further include determining a value of a quantitative parameter of the subject based on the first value and the second value.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 5 is a flowchart illustrating an exemplary process 500 for determining a first value of a signal representation according to some embodiments of the present disclosure;

FIG. 6 is a flowchart illustrating an exemplary process 600 for determining a first value of a signal representation according to some embodiments of the present disclosure;

DETAILED DESCRIPTION

Figure 1:
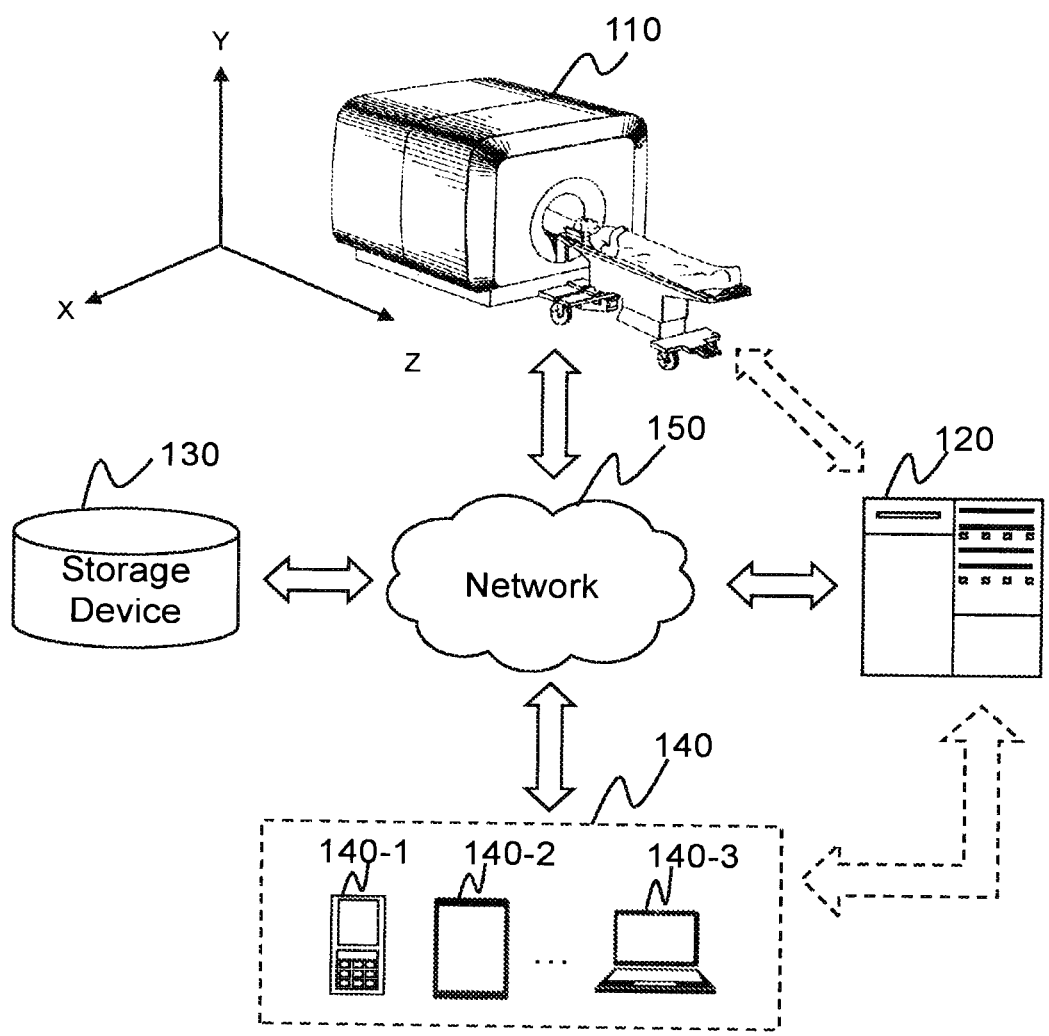
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise.

It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "device," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, a device, or a portion thereof.

It will be understood that when a unit, device, module or block is referred to as being "on," "connected to," or "coupled to," another unit, device, module, or block, it may be directly on, connected or coupled to, or communicate with the other unit, device, module, or block, or an intervening unit, device, module, or block may be present, unless the context clearly indicates otherwise. As used herein, the term "and/or" includes any and all combinations of one or more of the associated listed items. The term "pixel" and "voxel" in the present disclosure are used interchangeably to refer to an element in an image. An anatomical structure shown in an image of a subject (e.g., a patient) may correspond to an actual anatomical structure existing in or on the subject's body. For example, a body part shown in an image may correspond to an actual body part existing in or on the subject's body, and a feature point in an image may correspond to an actual physical point existing in or on the subject's body. For the convenience of descriptions, an anatomical structure shown in an image and its corresponding actual anatomical structure are used interchangeably. For example, the chest of the subject refers to the actual chest of the subject or a region representing the chest in an image of the subject. The term "image" in the present disclosure is used to refer to images of various forms, including a 2-dimensional image, a 3-dimensional image, a 4-dimensional image, etc.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Moreover, while the systems and methods disclosed in the present disclosure are described primarily regarding performing quantitative measurement in an MRI system. It should be understood that this is only for illustration purposes. The systems and methods of the present disclosure may be applied to any other kind of medical imaging system. In some embodiments, the imaging system may include a single modality imaging system and/or a multi-modality imaging system. The single modality imaging system may include, for example, the MRI system. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

As used herein, performing quantitative measurement in MRI refers to determining one or more quantitative parameters of a subject based on data collected using MRI techniques.

Recently, a multiple dimensional integration (MDI) technology has been used for determining a value of a quantitative parameter of a subject. For example, since a quantitative parameter of a subject may be associated with a signal representation of the subject acquired or determined in an examination or imaging of the subject, the quantitative parameter of the subject may be determined using the MDI technology based on the signal representation of the subject. Specifically, using the MRI technology, the value of the signal representation of the subject may be determined based on a plurality of signals of the subject that are generated using an MRI device. Each of the plurality of signals may correspond to a set of values in a plurality of signal dimensions of signal acquisition using the MRI device. Specifically, the signal dimensions may include a primary signal dimension associated with the signal representation and at least one secondary signal dimension other than the primary signal dimension. The MDI technology can jointly process the different signal dimensions of the signals, including the primary signal dimension and the at least one secondary signal dimension. Further, the value of the quantitative parameter of the subject may be determined based on the value of the signal representation of the subject.

However, conventionally, the value of the signal representation of the subject is determined along only one direction (e.g., a direction in which the signals decay as an echo time increases) of the primary signal dimension among the plurality of signal dimensions. Therefore, the value of the quantitative parameter of the subject is determined based on the value of the signal representation of the subject along one direction of the primary signal dimension. Due to the existence of noises, such determination manner of the signal representation may result in inherent calculation bias for quantitative parameters determined based on signals with moderate or relatively low signal-to-noise ratios (SNRs), thereby having a reduced accuracy. Therefore, it is desirable to provide systems and methods for determining quantitative parameters with improved accuracy.

An aspect of the present disclosure relates to systems and methods for determining a value of a quantitative parameter of a subject in MRI. The systems may acquire a plurality of signals of the subject. The plurality of signals may be generated using an MRI device. Each signal may correspond to a set of values in a plurality of signal dimensions of signal acquisition using the MRI device. The systems may determine a primary signal dimension associated with a signal representation of the subject among the plurality of signal dimensions. The systems may also determine a first value and a second value relating to the signal representation of the subject based on the plurality of signals. The first value may represent the signal representation along a first direction of the primary signal dimension, and the second value may represent the signal representation along a second direction of the primary signal dimension, wherein the first direction is opposite to the second direction. Further, the systems may determine the value of the quantitative parameter of the subject based on the first value and the second value.

Compared with the conventional quantitative measurement approaches using the MDI technology, the methods and systems of the present disclosure determine the value of the quantitative parameter of the subject based on the first value and the second value that represent the signal representation along the first direction and the second direction of the primary signal dimension, which may improve the accuracy, stability, and reliability of the determination of the value of the quantitative parameter.

FIG. 1 is a schematic diagram illustrating an exemplary MRI system 100 according to some embodiments of the present disclosure. As shown in FIG. 1, the MRI system 100 may include an MR scanner 110, a processing device 120, a storage device 130, one or more terminals 140, and a network 150. In some embodiments, the MR scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MR scanner 110 may be connected to the processing device 120 through the network 150. As another example, the MR scanner 110 may be connected to the processing device 120 directly.

The MR scanner 110 may be configured to scan a subject (or a part of the subject) to acquire image data, such as echo signals (or MR signals) associated with the subject. For example, the MR scanner 110 may detect a plurality of echo signals by applying an MR pulse sequence on the subject. In some embodiments, the MR scanner 110 may include, for example, a magnetic body, a gradient coil, an RF coil, etc., as described in connection with FIG. 2. In some embodiments, the MR scanner 110 may be a permanent magnet MR scanner, a superconducting electromagnet MR scanner, or a resistive electromagnet MR scanner, etc., according to types of the magnetic body. In some embodiments, the MR scanner 110 may be a high-field MR scanner, a mid-field MR scanner, and a low-field MR scanner, etc., according to the intensity of the magnetic field.

The subject may be biological or non-biological. For example, the subject may include a patient, a man-made object, etc. As another example, the subject may include a specific portion, organ, tissue, and/or a physical point of the patient. For example, the subject may include head, brain, neck, body, shoulder, arm, thorax, cardiac, stomach, blood vessel, soft tissue, knee, feet, or the like, or a combination thereof.

The processing device 120 may process data and/or information obtained from the MR scanner 110, the storage device 130, and/or the terminal(s) 140. For example, the processing device 120 may generate an MR image by processing image data (e.g., echo signals) collected by the MR scanner 110. As another example, the processing device 120 may determine a value of a quantitative parameter of the subject based on the image data (e.g., echo signals) of the subject collected by the MR scanner 110.

In some embodiments, the processing device 120 may be a single server or a server group. The server group may be centralized or distributed. In some embodiments, the processing device 120 may be local or remote. Merely for illustration, only one processing device 120 is described in the medical system 100. However, it should be noted that the medical system 100 in the present disclosure may also include multiple processing devices. Thus, operations and/or method steps that are performed by one processing device 120 as described in the present disclosure may also be jointly or separately performed by the multiple processing devices. For example, if in the present disclosure the processing device 120 of the medical system 100 executes both process A and process B, it should be understood that the process A and the process B may also be performed by two or more different processing devices jointly or separately in the medical system 100 (e.g., a first processing device executes process A and a second processing device executes process B, or the first and second processing devices jointly execute processes A and B).

The storage device 130 may store data, instructions, and/or any other information. In some embodiments, the storage device 130 may store data obtained from the MR scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or a combination thereof. In some embodiments, the storage device 130 may be implemented on a cloud platform.

In some embodiments, the storage device 130 may be connected to the network 150 to communicate with one or more other components in the MRI system 100 (e.g., the MR scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable a user interaction between a user and the MRI system 100. For example, the terminal(s) 140 may receive an instruction to cause the MR scanner 110 to scan the subject from the user. As another example, the terminal(s) 140 may receive a processing result (e.g., a value of a quantitative parameter of the subject) from the processing device 120 and display the processing result to the user. In some embodiments, the terminal(s) 140 may be connected to and/or communicate with the MR scanner 110, the processing device 120, and/or the storage device 130. In some embodiments, the terminal(s) 140 may include a mobile device 140-1, a tablet computer 140-2, a laptop computer 140-3, or the like, or a combination thereof. In some embodiments, the terminal(s) 140 may include an input device, an output device, etc. In some embodiments, the terminal(s) 140 may be part of the processing device 120 or the MR scanner 110.

The network 150 may include any suitable network that can facilitate the exchange of information and/or data for the MRI system 100. In some embodiments, one or more components of the MRI system 100 (e.g., the MR scanner 110, the processing device 120, the storage device 130, the terminal(s) 140, etc.) may communicate information and/or data with one or more other components of the MRI system 100 via the network 150. For example, the processing device 120 may obtain image data (e.g., an echo signal) from the MR scanner 110 via the network 150. As another example, the processing device 120 may obtain user instructions from the terminal(s) 140 via the network 150.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the storage device 130 may be a data storage including cloud computing platforms, such as a public cloud, a private cloud, a community and hybrid cloud, etc. In some embodiments, the processing device 120 may be integrated into the MR scanner 110. However, those variations and modifications do not depart the scope of the present disclosure.

Figure 2:
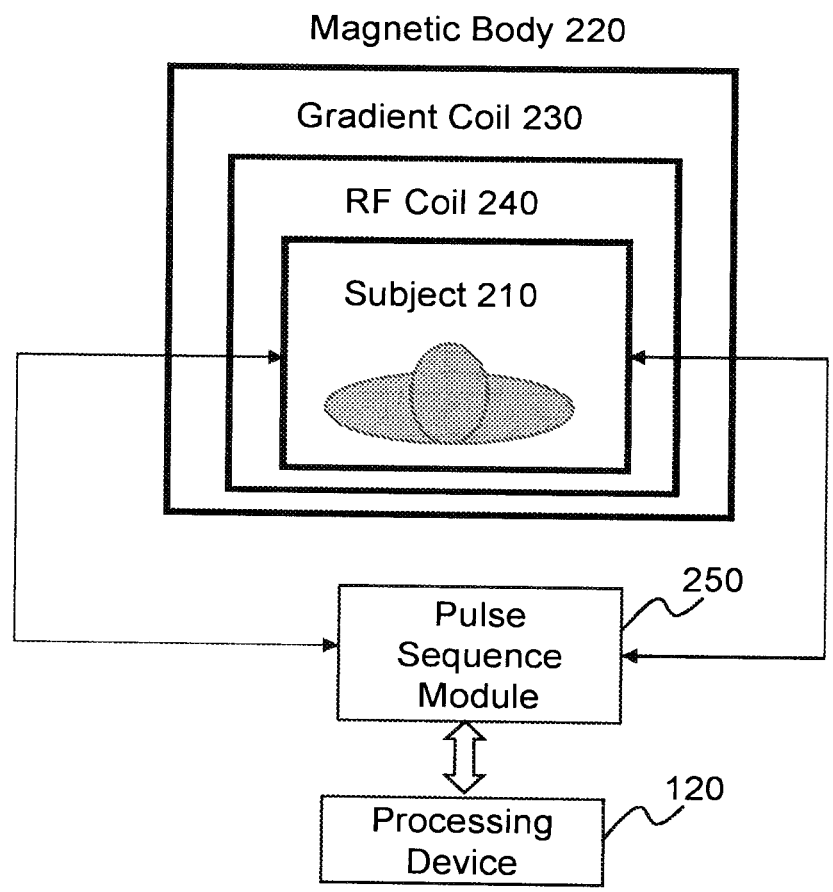
FIG. 2 is a block diagram illustrating an exemplary MR scanner according to some embodiments of the present disclosure.

FIG. 2 is a block diagram illustrating an exemplary MR scanner 110 according to some embodiments of the present disclosure. As illustrated in FIG. 2, the MR scanner 110 may include a magnetic body 220, a gradient coil 230, an RF coil 240, and a pulse sequence module 250.

The magnetic body 220 may generate a static magnetic field during the scanning of at least a portion of a subject 210. The magnetic body 220 may be of various types including, for example, a permanent magnet, a superconducting electromagnet, a resistive electromagnet, etc.

The gradient coil 230 may provide magnetic field gradients to the main magnetic field in an X direction, a Y direction, and/or a Z direction. As used herein, the X direction, the Y direction, and the Z direction may represent an X axis, a Y axis, and a Z axis in a coordinate system. For example, the Z axis may be along the axis of the magnetic body 220, the X axis and the Z axis may form a horizontal plane, and the X axis and the Y axis may form a vertical plane. In some embodiments, the gradient coil 230 may include an X-direction coil for providing a magnetic field gradient to the main magnetic field in the X direction, a Y-direction coil for providing a magnetic field gradient to the main magnetic field in the Y direction, and/or Z-direction coil for providing a magnetic field gradient to the main magnetic field in the Z direction. In some embodiments, the X-direction coil, the Y-direction coil, and/or the Z-direction coil may be of various shape or configuration.

The RF coil 240 may emit RF pulse signals to and/or receive echo signals from the subject 210 being examined. In some embodiments, the RF coil 240 may include a transmitting coil and a receiving coil. The transmitting coil may emit signals (e.g., RF pulses) that may excite a nucleus in the subject 210 to provide a resonation. The receiving coil may receive echo signals emitted from the subject 210. In some embodiments, the RF transmitting coil and RF receiving coil may be integrated into one same coil. In some embodiments, the RF coil 240 may be of various types including, for example, a quadrature detection (QD) orthogonal coil, a phased-array coil, a specific element spectrum coil, etc. In some embodiments, the RF coil 240 may be a phased-array coil that includes multiple coil units (also referred to as RF receiving coil units herein), each of which may detect echo signals independently.

In some embodiments, the RF coil 240 may be used to detect signals generated by an MR pulse sequence (also referred to as an MRI protocol herein). The MR pulse sequence may be of various types, such as a spin echo (SE) pulse sequence, a gradient refocused echo (GRE) pulse sequence, an inversion recovery (IR) pulse sequence, a multi-echo MR pulse sequence, a T1ρ-prepared pulse sequence, a T2-prepared pulse sequence, a diffusion weighted imaging (DWI) pulse sequence, etc. As used herein, the multi-echo MR pulse sequence may refer to a pulse sequence in which a plurality of signals of a plurality of echoes are produced (or detected) after every excitation pulse. The T1ρ-prepared pulse sequence may refer to a pulse sequence that includes a T1ρ weighted magnetization preparation pulse (also referred to as a spin-lock pulse). The T2-prepared pulse sequence may refer to a pulse sequence that includes a T2 preparation pulse. The DWI pulse sequence may refer to a pulse sequence (normally a spin echo sequence) having a pair of diffusion-sensitizing gradients applied before and after, e.g., a 180-degree pulse in the pulse sequence.

In some embodiments, the MR pulse sequence may be defined by one or more parameters including, for example, the type of the MR pulse sequence, a time for applying the MR pulse sequence, a duration of the MR pulse sequence, relating to an RF pulse in the MR pulse sequence, a count (or number) of RF pulses in the MR pulse sequence, a unit repetition time (TR), a repetition count, an inversion time (TI), a b-value, a T1ρ-preparation duration, a T2-preparation duration, an echo train length, an echo spacing, a velocity encoding (VENC) value, a count (or number) of averages, etc. As used herein, the TR may refer to the timespan between two repeating and consecutive RF pluses in an MR pulse sequence (e.g., the timespan between two consecutive excitation RF pulses in an SE pulse sequence, the timespan between two consecutive 180° inversion pulses in an IR pulse sequence). The repetition count may refer to the count (or number) of repetitions in an MR pulse sequence. The TI may refer to the timespan between a 180° inversion pulse and a following 90° excitation pulse in an IR pulse sequence. The b-value may refer to a factor that reflects the strength and timing of diffusion-sensitizing gradients in a DWI pulse sequence. The T1ρ-preparation duration may refer to the duration of a spin-lock pulse in a T1ρ-prepared pulse sequence. The T2-preparation duration may refer to the duration of a T2 preparation pulse in a T2-prepared pulse sequence.

In some embodiments, the RF coil 240 may detect (or receive) one or more echo signals corresponding to one or more echoes excited by the MR pulse sequence. In some embodiments, an echo signal (or an echo) may be defined by one or more parameters, for example, an echo signal type (a spin echo, a fast spin echo (FSE), a fast recovery FSE, a single shot FSE, a gradient recalled echo, a fast imaging with steady-state precession), an echo time (TE), an echo signal intensity, a coil unit (e.g., denoted by an identification (ID) or a serial number of the coil unit) that detects the echo signal, a repetition (e.g., denoted by a repetition serial number) in which the echo signal is detected, etc. The TE may refer to the time between an application of an excitation RF pulse and the peak of an echo excited by the excitation RF pulse.

The pulse sequence module 250 may be configured to define parameters and arrangements relating to the MR scanner 110 before and/or during the scan of the subject 210. In some embodiments, the parameters relating to the MR scanner 110 may include one or more parameters relating to an MR pulse sequence (e.g., the type of the MR pulse sequence, a TR, a repetition count, a TI, etc.) applied by the MR scanner 110, one or more parameters relating to a gradient field generated by the gradients coil 230 or a radiofrequency field (e.g. an RF center frequency, a flip angle), one or more parameters relating to echo signals (e.g., a TE, a spin echo type) detected by the RF coil 240 as described elsewhere in the disclosure, or the like, or any combination thereof. In some embodiments, the parameters relating to the MR scanner 110 may include one or more other imaging parameters, such as, a count (or number) of RF channels, an image contrast and/or ratio, a slice thickness, an imaging type (e.g., a T1 weighted imaging, a T2 weighted imaging, a proton density weighted imaging, etc.), a field of view (FOV) of the MR scanner 110, an off-center frequency shift of the MR scanner 110, or the like, or a combination thereof.

In some embodiments, the pulse sequence module 250 may be connected to and/or communicate with the processing device 120. For example, before an MR scanning process, at least one portion of the parameters and arrangements relating to the MR scanner 110 may be designed and/or determined by the processing device 120 according to clinical demands or a scanning protocol, and transmitted to the pulse sequence module 250. In an MR scanning process, the MR scanner 110 may scan the subject 210 based on the parameters and arrangements defined by the pulse sequence module 250. For example, the MR scanner 110 may apply an MR pulse sequence with specific parameters relating to MR pulse sequences defined by the pulse sequence module 250, and the RF coil 240 may receive echo signals according to specific parameters relating to echo signals defined by the pulse sequence module 250. In some embodiments, an echo signal and data generated based on the echo signal (e.g., image data or K-space data) may be defined by the parameters relating to the MR scanner 110 under which the echo signal is acquired using the MR scanner 110. For example, the parameters relating to the MR scanner 110 under which the echo signal is acquired may be regarded as a plurality of signal dimension of the echo signal and the data generated based on the echo signal. More descriptions regarding the signal dimensions may be found elsewhere in the present disclosure. See, e.g., FIG. 4 and relevant descriptions thereof.

This description regarding the MR scanner 110 provided above is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the pulse sequence module 250 may be integrated into the processing device 120. However, those variations and modifications do not depart the scope of the present disclosure.

Figure 3:
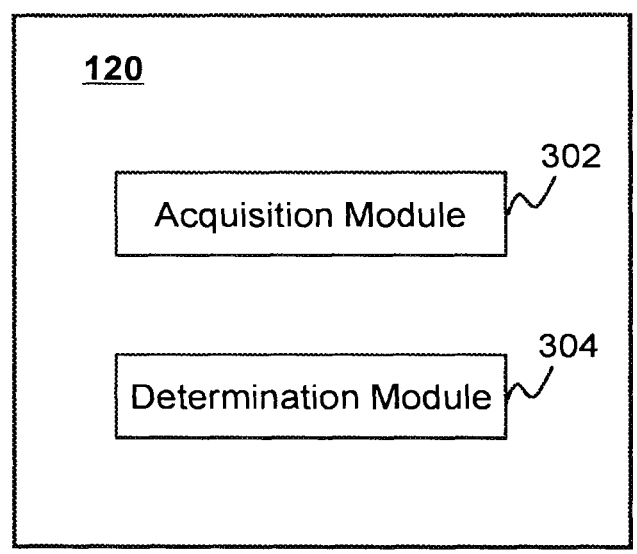
FIG. 3 is a block diagram illustrating exemplary processing device 120 according to some embodiments of the present disclosure.

FIG. 3 is a block diagram illustrating exemplary processing device 120 according to some embodiments of the present disclosure.

As shown in FIG. 3, the processing device 120 may include an acquisition module 302 and a determination module 304.

The acquisition module 302 may be configured to obtain information relating to the MRI system 100. For example, the acquisition module 202 may obtain acquire a plurality of signals of a subject. The plurality of signals may be generated using an MRI device, and each of the plurality of signals may correspond to a set of values in a plurality of signal dimensions of signal acquisition using the MRI device. More descriptions regarding the obtaining of the plurality of signals of the subject may be found elsewhere in the present disclosure. See, e.g., operation 410 in FIG. 4, and relevant descriptions thereof.

The determination module 304 may be configured to determine a primary signal dimension associated with a signal representation of the subject among the plurality of signal dimensions. As used herein, the signal representation may refer to a representative value or an attribute value of the signals of the subject. The signal representation of the subject may reflect one or more physiological characteristics or physical characteristics of the subject, which may provide a basis for medical diagnosis and/or treatment. More descriptions regarding the determination of the primary signal dimension may be found elsewhere in the present disclosure. See, e.g., operation 420 in FIG. 4, and relevant descriptions thereof.

The determination module 304 may be also configured to determine a first value and a second value relating to the signal representation of the subject based on the plurality of signals. The first value may represent the signal representation along a first direction of the primary signal dimension, the second value may represent the signal representation along a second direction of the primary signal dimension, and the first direction may be opposite to the second direction. More descriptions regarding the determination of the first value and the second value may be found elsewhere in the present disclosure. See, e.g., operation 430 in FIG. 4, and relevant descriptions thereof.

The determination module 304 may be also configured to determine a value of a quantitative parameter of the subject based on the first value and the second value. The primary signal dimension and the signal representation may be associated with the quantitative parameter. More descriptions regarding the determination of the value of the quantitative parameter of the subject may be found elsewhere in the present disclosure. See, e.g., operation 440 in FIG. 4, and relevant descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, any one of the modules may be divided into two or more units. For instance, the acquisition module 302 may be divided into two units configured to acquire different data. In some embodiments, the processing device 120 may include one or more additional modules, such as a storage module (not shown) for storing data.

Figure 4:
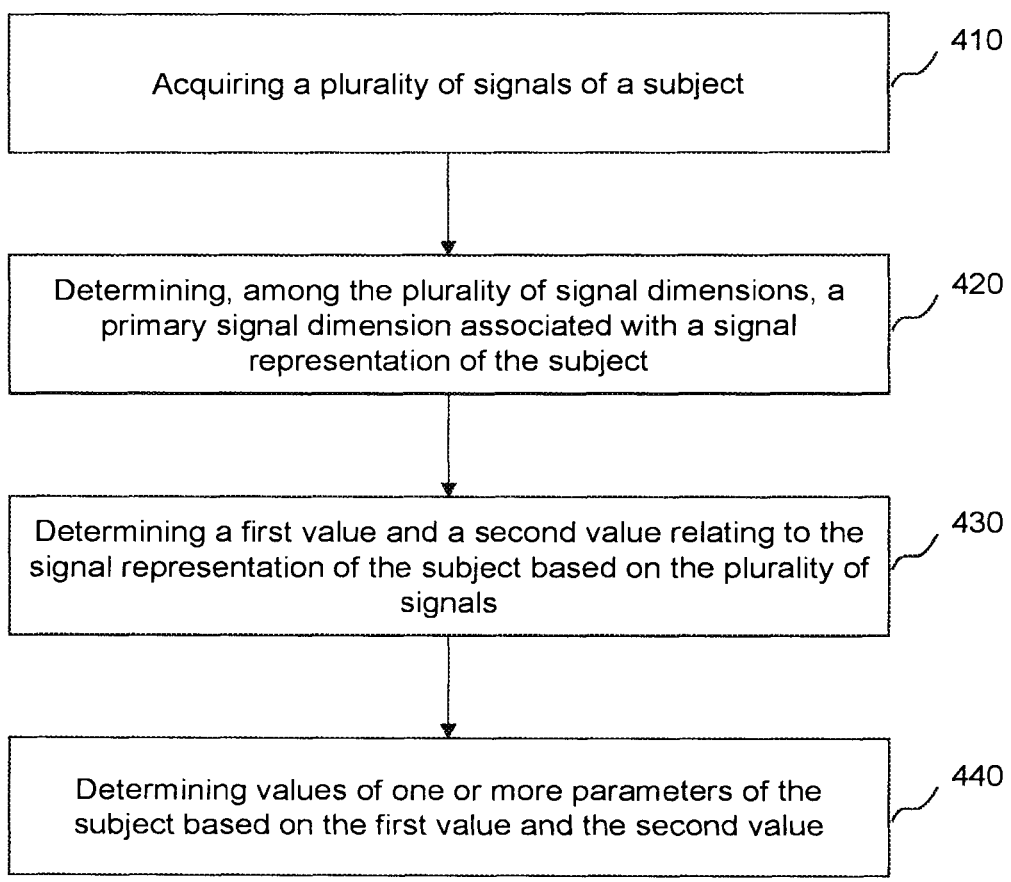
FIG. 4 is a flowchart illustrating an exemplary process 400 for performing quantitative measurement in MRI according to some embodiments of the present disclosure.

FIG. 4 is a flowchart illustrating an exemplary process 400 for performing quantitative measurement in MRI according to some embodiments of the present disclosure. In some embodiments, process 400 may be executed by the MRI system 100. For example, the process 400 may be implemented as a set of instructions (e.g., an application) stored in a storage device (e.g., the storage device 130). In some embodiments, the processing device 120 (e.g., one or more modules illustrated in FIG. 3) may execute the set of instructions and may accordingly be directed to perform the process 400. The operations of the illustrated process presented below are intended to be illustrative. In some embodiments, the process 400 may be accomplished with one or more additional operations not described and/or without one or more of the operations discussed. Additionally, the order of the operations of process 400 illustrated in FIG. 4 and described below is not intended to be limiting.

In 410, the processing device 120 (e.g., the acquisition module 302) may acquire a plurality of signals of a subject.

As used herein, the subject may refer to any biological or non-biological subject, such as a patient (or a portion of the patient), a man-made object (e.g., a phantom). In some embodiments, the subject may refer to a physical point of an object (e.g., a patient, an organ or tissue of the patient, an animal). For illustration purposes, a patient is described as an exemplary object in the following descriptions.

In some embodiments, the plurality of signals may be generated using an MRI device (e.g., the MR scanner 110), for example, by applying a multi-echo pulse sequence on the subject. As used herein, a signal of the subject may convey information about one or more attributes or characteristics of the subject. For example, the signals of the subject may be or include image data or K-space data relating to the subject.

In some embodiments, the processing device 120 may cause the MRI device to apply an MR pulse sequence (e.g., an SE pulse sequence, a GRE pulse sequence, an IR pulse sequence, a multi-echo pulse sequence, a T1ρ-prepared pulse sequence, a T2-prepared pulse sequence, a DWI pulse sequence as described elsewhere in this disclosure) to scan the subject.

In some embodiments, the processing device 120 may cause the MRI device to apply the MR pulse sequence on the patient. The MRI device may include a plurality of coil units, which may detect a plurality of echo signals excited by the MR pulse sequence during the scan. The processing device 120 may further determine the plurality of signals based on the echo signals detected by the coil units. For example, the processing device 120 may fill the echo signals into a plurality of regions of a K-space (e.g., a k-space matrix) to generate a plurality of sets of k-space data, wherein the plurality of sets of k-space data may be designated as the signals of the subject. As another example, the subject may be a physical point of a patient. The processing device 120 may reconstruct a plurality of images based on the plurality of echo signals. Each image may include image data (e.g., a pixel having a specific pixel value, a voxel having a specific voxel value) of the physical point. The processing device 120 may then designate the image data of the physical point in the images as the signals of the physical point. As yet another example, the echo signals may form a plurality of echo trains based on a trajectory of k-space. The plurality of echo trains may be designated as the signals of the subject.

In some embodiments, the echo signals may be complex signals or real number signals, and the signals of the subject determined based on the echo signals may have complex numbers or real numbers. Merely by way of example, the subject may be a physical point of a patient. Each of the reconstructed images may include a complex pixel value or a real number pixel value of a pixel corresponding to the physical point. The complex pixel value or the real number pixel value of the physical point in each image may be designated as one of the signals of the subject.

In some embodiments, the plurality of signals of the subject may be previously determined by the processing device 120 or another computing device, and stored in a storage device of the MRI system 100 (e.g., the storage device 130) or an external source. The processing device 120 may acquire the signals from the storage device 130 or the external source.

In some embodiments, each of the signals of the subject may correspond to a set of values in a plurality of signal dimensions of signal acquisition using the MRI device. As used herein, a signal dimension of a signal may refer to a parameter that describes an instance under which the signal is determined or acquired using the MRI device. In some embodiments, the plurality of signal dimensions may include an echo time (TE), an unit repetition time (TR), an inversion recovery time (TI), a b-value, a T1ρ-preparation duration, a T2-preparation duration, a repetition, a velocity encoding value, a count of radio frequency (RF) channels, a flip angle, an RF center frequency, an RF receiving coil unit, or the like, or any combination thereof. Merely by way of example, a signal A of the subject may be a pixel value of a physical point in an image, wherein the image may be reconstructed based on an echo signal detected by the MRI device during a scan of the subject. The signal dimensions corresponding to the signal A may include, for example, one or more parameters relating to the MRI device during the scan of the subject, one or more parameters relating to the determination of the signal A based on the corresponding image (e.g., a coordinate of a corresponding pixel in the image), etc. Exemplary parameters relating to the MRI device during the scan may include one or more parameters relating to the MR pulse sequence (e.g., a TE, a TR, a TI, a b-value, a T1ρ-preparation duration, a T2-preparation duration, a velocity encoding value, a repetition) applied during the scan, one or more parameters relating to a gradient field or radiofrequency field (e.g. an RF center frequency, a flip angle) applied during the scan, one or more other imaging parameters (e.g., a count (or number) of RF channels, a coil unit) of the MRI device, or the like, or any combination thereof. More descriptions regarding the parameters relating to the MRI device during the scan of the subject may be found elsewhere in the present disclosure. See, e.g., FIG. 2 and relevant descriptions thereof.

For illustration purposes, an example of a plurality of signals of a physical point $P_r$ of a patient is provided in Table 1 as below. The signals of $P_r$ may be acquired using an MRI device having m coil units. The MRI device may be caused to apply a multi-echo pulse sequence including 2 repetitions on the patient. In each repetition, each coil unit may detect n echo signals corresponding to n echoes sequentially occurred at different TEs (denoted as $TE_1$, $TE_2$, . . . , and $TE_n$). In some embodiments, the plurality of echoes may sequentially occur at a substantially same time interval (denoted as ΔTE) between successive echoes. The echo signals detected by each coil unit may be used to reconstruct a series of images, each of which may include a pixel value of a pixel corresponding to a physical point $P_r$ (referred to as the pixel value of $P_r$ for brevity). The pixel values of $P_r$ in the images may be designated as the signals of $P_r$. In some embodiments, a pixel value of $P_r$ in an image may reflect a signal intensity of MRI signals of the physical point $P_r$.

TABLE 1

An example of a plurality of signals of a physical point $P_r$

| Repitition$_1$ | | | Repitition$_2$ | | |
|---|---|---|---|---|---|
| Coil$_1$ | . . . | Coil$_m$ | Coil$_1$ | . . . | Coil$_m$ |
| $S_{e_1}^1(r)$ | . . . | $S_{e_1}^m(r)$ | $S_{e_1}^{1\prime}(r)$ | . . . | $S_{e_1}^{m\prime}(r)$ |
| $S_{e_2}^1(r)$ | . . . | $S_{e_2}^m(r)$ | $S_{e_2}^{1\prime}(r)$ | . . . | $S_{e_2}^{m\prime}(r)$ |
| . . . | . . . | . . . | . . . | . . . | . . . |
| $S_{e_n}^1(r)$ | . . . | $S_{e_n}^m(r)$ | $S_{e_n}^{1\prime}(r)$ | . . . | $S_{e_n}^{m\prime}(r)$ | where $S_{e_1}^1(r)$ to $S_{e_n}^{m\prime}(r)$ refer to the plurality of signals of $P_r$, $S_{e_n}^m(r)$ refers a pixel value of $P_r$ in an image that is reconstructed based on the $n^{th}$ echo signal detected by the $m^{th}$ coil unit in Repitition$_1$, and $S_{e_n}^{m\prime}$ refers a pixel value of $P_r$ in an image that is reconstructed based on the $n^{th}$ echo signal detected by the $m^{th}$ coil unit in Repitition$_2$.

Each signal of $P_r$ in Table 1 may correspond to a set of values in a plurality of signal dimensions of signal acquisition using the MRI device. Exemplary signal dimensions may include an echo time, a coil unit, a repetition, or the like, or any combination thereof. For example, the $S_{e_n}^m(r)$ may correspond to $TE_n$ in the echo time dimension, m in the coil unit dimension, and 1 in the repetition dimension. It should be noted that the above example illustrated in Table 1 is merely provided for the purposes of illustration, and not intended to limit the scope of the present disclosure. For example, the multi-echo pulse sequence applied on the patient may include only one repetition and/or more than one flip angle.

In 420, the processing device 120 (e.g., the determination module 304) may determine, among the plurality of signal dimensions, a primary signal dimension associated with a signal representation of the subject.

As used herein, the signal representation may refer to a representative value or an attribute value of the signals of the subject. The signal representation of the subject may reflect one or more physiological characteristics or physical characteristics of the subject, which may provide a basis for medical diagnosis and/or treatment.

A signal dimension may be regarded as being associated with the signal representation if the signal dimension and the signal representation have a certain mathematical correlation (e.g., an index correlation, a linear correlation, or any other mathematical correlation). For illustration purposes, the $P_r$ is described as an exemplary subject and exemplary primary signal dimensions of the signals of $P_r$ is provided hereinafter. Referring back to the example in Table 1, the MRI device may be caused to scan the patient using the multi-echo pulse sequence. The signal representation of $P_r$ may be a change of signal intensity at $P_r$ over the time interval ΔTE between successive echoes, which is denoted as ΔS1(r). As used herein, a signal intensity at $P_r$ may refer to an intensity or strength of MRI signals of the $P_r$. In some embodiments, the signal representation ΔS1(r) may be associated with the echo time as illustrated in Equation (1) or Equation (2) as below:

$$\Delta S1(r) = e^{-\Delta TE/T_2^*(r) + i\gamma\Delta B(r)\Delta TE}, \quad (1)$$

and $$\Delta S1(r) = e^{-\Delta TE/T_2(r)}, \quad (2)$$

where $T_2^*(r)$ and $T_2(r)$ refer to a transverse relaxation time of $P_r$, $\gamma$ refers to a gyromagnetic ratio, $\Delta B(r)$ refers to a local field distribution at $P_r$. In this case, the primary signal dimension may be the echo time that is associated with $\Delta S1(r)$.

As another example, the MRI device may be caused to scan the patient using a T2-prepared pulse sequence, which includes a plurality of T2 preparation pulses with different T2-preparation durations. The signal representation of $P_r$ may be a change of signal intensity at $P_r$ over a time interval $\Delta\partial$, which is denoted as $\Delta S2$. $\Delta\partial$ may refer to a time difference between two T2-preparation durations corresponding to two successive T2 preparation pulses in the T2-prepared pulse sequence. The signal representation $\Delta S2$ may be associated with T2-preparation duration as illustrated in Equation (3) as below:

$$\Delta S2(r) = e^{-\Delta\partial/T_2(r)}, \quad (3)$$

where $T_2(r)$ refers to a transverse relaxation time of $P_r$. In this case, the primary signal dimension may be the T2-preparation duration that is associated with $\Delta S2(r)$.

As yet another example, the MRI device may be caused to scan the patient using a T1ρ-prepared pulse sequence, which includes a plurality of T1ρ weighted magnetization preparation pulses with different T1ρ-preparation durations. The signal representation of $P_r$ may be a change of signal intensity at $P_r$ over a time interval $\Delta\tau$, which may be denoted as $\Delta S3$. $\Delta\tau$ may refer to a time difference between two T1ρ-preparation durations corresponding to two successive T1ρ weighted magnetization preparation pulses in the T1ρ-prepared pulse sequence. The signal representation $\Delta S3$ may be associated with the T1ρ-preparation duration as illustrated in Equation (4) as below:

$$\Delta S3(r) = e^{-\Delta\tau/T_{1\rho}(r)}, \quad (4)$$

where $T_{1\rho}(r)$ refers to a longitudinal relaxation time in a rotating frame of $P_r$. In this case, the primary signal dimension may be the T1ρ-preparation duration that is associated with $\Delta S3(r)$.

As yet another example, the MRI device may be caused to scan the patient using an IR pulse sequence, which includes a plurality of excitation pulses at different TIs. The signal representation of $P_r$ may be a change of signal intensity at $P_r$ over $\Delta TI$, which is denoted as $\Delta S4(r)$. $\Delta TI$ may refer to a time difference between two TIs corresponding to two successive excitation pulses in the IR pulse sequence. In some embodiments, the signal representation $\Delta S4(r)$ may be associated with the inversion time as illustrated in Equation (5) as below:

$$\Delta S4(r) = e^{-\Delta TI/T_1(r)}, \quad (5)$$

where $T_1(r)$ refers a longitudinal relaxation time of $P_r$. In this case, the primary signal dimension may be the inversion time that is associated with $\Delta S4(r)$.

As yet another example, the MRI device may be caused to apply a DWI pulse sequence on the patient, which includes a plurality of pairs of diffusion-sensitizing gradients with different b-values. The signal representation of $P_r$ may be a change of signal intensity at $P_r$ with $\Delta b$, which is denoted as $\Delta S5$. $\Delta b$ may refer to a difference between two b-values corresponding to two successive pairs of diffusion-sensitizing gradients in the DWI pulse sequence. The signal representation $\Delta S5$ may be associated with the b-value as illustrated in Equation (6) as below:

$$\Delta S5(r) = e^{-\Delta b/ADC(r)}, \quad (6)$$

where $ADC(r)$ refers an apparent diffusion coefficient (ADC) of $P_r$. In this case, the primary signal dimension may be the b-value that is associated with $\Delta S5(r)$.

In some embodiments, two or more signal dimensions of the plurality of signal dimensions may be associated with the signal representation. One of the two or more signal dimensions may be selected as the primary signal dimension. The selection may be performed by the processing device 120 autonomously or based on a user instruction.

In 430, the processing device 120 (e.g., the determination module 304) may determine a first value and a second value relating to the signal representation of the subject based on the plurality of signals.

The first value may represent the signal representation along a first direction of the primary signal dimension. The second value may represent the signal representation along a second direction of the primary signal dimension. The first direction may be opposite to the second direction. For example, if the primary signal dimension is the echo time, the first direction may be a direction in which the echo time increases (i.e., a direction in which the time elapses), and the second direction may be a direction in which the echo time decreases (i.e., a direction in which the time retrogrades). As another example, if the primary signal dimension is the T2-preparation duration, the first direction may be a sequential direction in which the T2 preparation durations are increased sequentially, and the second direction may be a direction opposite to the sequential direction in which the T2 preparation duration decreases.

In some embodiments, the processing device 120 may determine at least one secondary signal dimension among the plurality of signal dimensions. For each of at least one value in the at least one secondary signal dimension, the processing device 120 may determine a preliminary value of the signal representation along the first direction of the primary signal dimension (denoted as a preliminary value V1) based on a portion of the plurality of signals that correspond to the value of the at least one secondary signal dimension. Further, the processing device 120 may determine the first value of the signal representation based on at least a portion of the at least one preliminary value V1 of the signal representation.

In some embodiments, the processing device 120 may obtain an optimization function (also referred to as a first optimization function) of the signal representation. The optimization function may incorporate the primary signal dimension along the first direction. Further, the processing device 120 may determine the first value of the signal representation of the subject by inputting the plurality of signals into the optimization function.

More descriptions regarding the determination of the first value of the signal representation may be found elsewhere in the present disclosure (e.g., FIGS. 5 and 6, and the descriptions thereof).

In some embodiments, the determination of the second value of the signal representation may be performed in a similar manner as that of the first value of the signal representation. For example, for each of at least one value in the at least one secondary signal dimension, the processing device 120 may determine a preliminary value of the signal representation along the second direction of the primary signal dimension (denoted as a preliminary value V2) based on a portion of the plurality of signals that correspond to the value of the at least one secondary signal dimension. Further, the processing device 120 may determine the second value of the signal representation based on at least a portion of the at least one preliminary value V2 of the signal representation. As another example, the processing device 120 may obtain a second optimization function of the signal representation incorporating the primary signal dimension along the second direction. Further, the processing device 120 may determine the second value of the signal representation of the subject by inputting the plurality of signals into the second optimization function.

In 440, the processing device 120 (e.g., the determination module 304) may determine a value of a quantitative parameter of the subject based on the first value and the second value.

The primary signal dimension and the signal representation may be associated with the quantitative parameter. In some embodiments, a quantitative parameter may be regarded as being associated with a signal dimension if the quantitative parameter and the signal dimension have a certain correlation, e.g., a correlation that may be presented or described using a mathematical relationship (e.g., an index correlation, a linear correlation, or any other mathematical correlation). Similarly, a quantitative parameter may be regarded as being associated with a signal representation if the quantitative parameter and the signal representation have a certain correlation.

In some embodiments, the subject may be a physical point of an object, the signal representation may be a change of signal intensity at the physical point with an echo time. Exemplary quantitative parameters of the physical point may include a longitudinal relaxation time, a transverse relaxation time (T2 or T2*), a transverse relaxation rate (R2 or R2*), an apparent diffusion coefficient (ADC), a field distribution, a longitudinal relaxation time in a rotating frame, a signal-noise ratio indicator, or a signal-signal ratio indicator, or the like, or any combination thereof.

In some embodiments, the primary signal dimension may be an echo time, and the quantitative parameter may be the transverse relaxation time, the field distribution, or the like, or any combination thereof. Alternatively, the primary signal dimension may be a T2-preparation duration, and the quantitative parameter may be the transverse relaxation time. Alternatively, the primary signal dimension may be a T1ρ-preparation duration, and the quantitative parameter may be the longitudinal relaxation time in a rotating frame. Alternatively, the primary signal dimension may be an inversion time, and the quantitative parameter may be the longitudinal relaxation time. Alternatively, the primary signal dimension may be a b-value, and the quantitative parameter may be the ADC.

In some embodiments, the processing device 120 may determine a first preliminary value of the quantitative parameter of the subject based on the first value. The processing device 120 may also determine a second preliminary value of the quantitative parameter of the subject based on the second value. Further, the processing device 120 may determine the value of the quantitative parameter of the subject based on the first preliminary value and the second preliminary value of the quantitative parameter. More descriptions regarding the determination of the value of the quantitative parameter of the subject may be found elsewhere in the present disclosure (e.g., FIG. 7, and the descriptions thereof).

In some embodiments, the processing device 120 may determine a value of a signal-noise parameter indicative of a signal level of the plurality of signals relative to a noise level of the plurality of signals based on the first value and the second value. For example, the processing device 120 may determine a product of the first value and the second value as the value of the signal-noise parameter of the plurality of signals. In some embodiments, the subject may be one of a plurality of physical points of an object. The processing device 120 may perform process 400 for each physical point of the object to determine a corresponding value of the quantitative parameter. The values of the quantitative parameter of the physical points may reflect one or more physiological or physical characteristics of different portions of the patient, and thereby can be used in disease diagnosis. Further, the processing device 120 may generate a parametric map (e.g., a T2 map, a T2* map, a R2 map, a R2* map, etc.) relating to the quantitative parameter of the object based on the value of the quantitative parameter of each physical point of the object. The parametric map may be used for medical diagnosis. As used herein, the parametric map relating to the quantitative parameter of the object may be a map showing values of the quantitative parameter of the object at element locations (e.g., pixel locations, voxel locations) of the parametric map. Each element location may correspond to a physical point of the object.

In some embodiments, the processing device 120 may further perform noise analysis on the parametric map to determine the noise level of the parametric map. For example, at least one reference signal representation may be determined for the noise analysis. The at least one reference signal representation may be associated with the signal representation as described above.

For each of at least one reference signal representation, the processing device 120 may determine a value of a first signal-noise parameter indicative of a signal level of the reference signal representation relative to a noise level of the reference signal representation. Further, the processing device 120 may determine a value of a second signal-noise parameter indicative of a signal level of the parametric map relative to a noise level of the parametric map based on the value of the first signal-noise parameter of each reference signal representation.

Merely by way of example, the at least one reference signal representation may include a first reference signal representation and a second reference signal representation. The signal representation may be a ratio of the first reference signal representation to the second reference signal representation. Referring to Equation (9) for example, the first reference signal representation may be the denominator of Equation (9), and the second reference signal representation may be the numerator of Equation (9). The processing device 120 may expand the function representing the first reference signal representation to obtain an expanded expression corresponding to the first reference signal representation, wherein the expended expression includes noise-containing terms and signal-containing terms. The processing device 120 may extract the noise-containing terms from the expanded expression corresponding to the first reference signal representation. Further, the processing device 120 may determine the value of the first signal-noise parameter of the first reference signal representation based on the noise-containing terms and the plurality of signals of the subject. The value of the first signal-noise parameter of the second reference signal representation may be determined in a similar manner as the determination of the value of the first signal-noise parameter of the first reference signal representation. Further, the processing device 120 may determine a first preliminary value and a second preliminary value of a third signal-noise parameter indicative of a signal level of the signal representation relative to a noise level of the signal representation based on the values of the first signal-noise parameters of the first reference signal representation and the second reference signal representation. The first preliminary value of the third signal-noise parameter may correspond to the first direction of the primary signal dimension, and the second preliminary value of the third signal-noise parameter may correspond to the second direction of the primary signal dimension. Finally, the processing device 120 may determine the value of the second signal-noise parameter of the parametric map based on the first preliminary value and the second preliminary value of the third signal-noise parameter.

According to some embodiments of the present disclosure, the noise level of the parametric map (e.g., the value of the second signal-noise parameter) and/or the noise level of the signal representation (e.g., the first and second preliminary values of the third signal-noise parameter) may be determined based on the noise level of the at least one reference signal representation (e.g., the value of the first signal-noise parameter of each reference signal representation). Since the noise level of the at least one reference signal representation is easier to determine, the methods for performing noise analysis on the parametric map and the signal representation disclosed herein have an improved efficiency and can save computing resources compared with approaches that directly determine the noise level of the parametric map and the noise level of the signal representation.

It should be noted that the above descriptions regarding the process 400 are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

In some embodiments, after operation 420 is performed, the processing device 120 may directly perform operations 430 and 440 to determine the first value and the second value of the signal representation and subsequent determine the value(s) of the quantitative parameter(s) based on the first and second values.

Alternatively, after operation 420 is performed, the processing device 120 may determine whether the first and second values of the signal representation need to be determined. For example, the processing device 120 (e.g., the determination module 304) may determine, based on the signal representation of the subject, a value of a signal-noise parameter indicative of a signal level of the plurality of signals relative to a noise level of the plurality of signals. In some embodiments, the noise parameter may be used to analyze noise of the signal representation, which, in turn, may indicate a signal level of the signals relative to the noise level of the plurality of signals. For example, the value of the signal-noise parameter may be within a certain range, such as [0, 1]. The signals may be deemed as pure noises that include no or insignificant non-noise components if the value of the signal-noise parameter is equal or close to 1 (e.g., a difference between the signal-noise parameter and 1 is smaller than a threshold, such as 1%, 5%, 10%, etc.). The signals may be deemed as pure signals that include no or little noise if the value of the signal-noise parameter is equal or close to 0 (e.g., a difference between the signal-noise parameter and 1 is smaller than a threshold, such as 1%, 5%, 10%, etc.). In some embodiments, the signals may be deemed as including non-noise signals if the value of the signal-noise parameter may be smaller than a preset value, such as, 0.1.

The processing device 120 (e.g., the determination module 304) may determine whether the value of the signal-noise parameter is greater than a preset threshold. If the value of the signal-noise parameter is greater than the preset threshold, the processing device 120 may determine that the signals are noises or have a low signal level (or a high noise level), and the first and second values need to be determined. Thus, if the value of the signal-noise parameter is greater than the preset threshold, operations 430 and 440 may be performed. If the value of the signal-noise parameter is smaller than the preset threshold, the processing device 120 may determine that the signals include non-noise signals or have a high signal level (or a low noise level), the processing device 120 may directly determine a value of a quantitative parameter the subject merely based on one of the first and second values of the signal representation according to the conventional MDI approaches. Quantitative parameters determined by the conventional MDI approaches have a desirable accuracy if the signals have a relative low noise level. By determining the value of the signal-noise parameter of the signals and adaptively choosing the conventional MDI approaches based on the value of the signal-noise parameter, the computational amount in quantitative measurement may be reduced and the determination efficiency may be improved.

It should be noted that the above descriptions of the signal-noise parameter is provided for illustration purposes, and not intended to be limiting. In some alternative embodiments, the signals may be deemed as pure signals if the signal-noise parameter is equal to 1, and the signals may be deemed as pure noises if the signal-noise parameter is equal to 0.

In some embodiments, the processing device 120 may determine a reference value of the signal representation. In some embodiments, the reference value of the signal representation may be any one of the first value or the second value described in operation 430. The processing device 120 may determine an updated value of an updated signal representation of the subject by adding a signal disturbance into the plurality of signals. The updated signal representation may correspond to a same direction (e.g., the first direction or the second direction described in operation 430) of the primary signal dimension as the signal representation. Further, the processing device 120 may determine the value of the signal-noise parameter based on the signal representation and the updated signal representation of the subject.

As used herein, a signal disturbance refers to a noise that has a known signal variation level, which is deliberately added into a signal of a subject so as to generate the updated signal representation different from the signal representation. Adding the signal disturbance into a signal as used herein broadly refers to combining the signal disturbance and the signal in any suitable manner, for example, by summing up the signal disturbance with the signal, multiplying the signal disturbance with the signal, or the like, or any combination thereof. A signal disturbance may be of a same dimension (in a same unit) as the signal, or a dimensionless factor. The updated signal representation may be regarded as a signal representation of a combination of the plurality of signals and the signal disturbance.

In some embodiments, the processing device 120 may determine the value of the signal-noise parameter based on a relation function that measures a difference between the reference value of the signal representation and the updated value of the updated signal representation of the subject. The relation function may incorporate one or more processing operations including, for example, a linear operation (e.g., addition, subtraction, multiplication, division), a non-linear operation (e.g., an exponential function, a power function, a logarithmic function), or the like, or any combination thereof, performed on the signal representation and the updated signal representation. The value of the signal-noise parameter may be determined by inputting the reference value of the signal representation and the updated value of the updated signal representation into the relation function.

FIG. 5 is a flowchart illustrating an exemplary process 500 for determining a first value of a signal representation according to some embodiments of the present disclosure. In some embodiments, process 500 may be executed by the MRI system 100. For example, the process 500 may be implemented as a set of instructions (e.g., an application) stored in a storage device (e.g., the storage device 130). In some embodiments, the processing device 120 (e.g., one or more modules illustrated in FIG. 3) may execute the set of instructions and may accordingly be directed to perform the process 500. The operations of the illustrated process presented below are intended to be illustrative. In some embodiments, the process 500 may be accomplished with one or more additional operations not described and/or without one or more of the operations discussed. Additionally, the order of the operations of process 500 illustrated in FIG. 5 and described below is not intended to be limiting. In some embodiments, one or more operations of the process 500 may be performed to achieve at least part of operation 430 as described in connection with FIG. 4.

In 510, the processing device 120 (e.g., the determination module 304) may determine, among the plurality of signal dimensions, at least one secondary signal dimension.

The at least one secondary signal dimension may include any signal dimension of the signals of the subject other than the primary signal dimension. In some embodiments, each of the secondary signal dimension may be not associated (or correlate) with the signal representation. In some embodiments, the at least one secondary signal dimension may include all or a portion of the signal dimensions of the signals of the subject other than the primary signal dimension. In some embodiments, a signal dimension may be determined as a secondary signal dimension if it is not associated with the signal representation and has two or more values in the signal dimension. For example, referring back to the example in Table 1, the at least one secondary signal dimension may include two secondary signal dimensions, the coil unit dimension and the repetition dimension, which is not associated with the $\Delta S1(r)$ according to Equation (1) as described above. If the multi-echo pulse sequence applied on the patient includes only one repetition (i.e., there is only one value in the repetition), the repetition may not be designated as a secondary signal dimension.

In 520, for each of at least one value in the at least one secondary signal dimension, the processing device 120 (e.g., the determination module 304) may determine, based on a portion of the plurality of signals that correspond to the value of the at least one secondary signal dimension, at least one preliminary value of the signal representation along the first direction of the primary signal dimension.

For illustration purposes, the following description is provided with reference to the example in Table 1 as described in connection with FIG. 4. It is assumed that the signal representation to be determined is $\Delta S1(r)$ (i.e., the change of signal intensity at the physical point $P_r$ of the patient over $\Delta TE$). As described above, the primary signal dimension associated with $\Delta S1(r)$ may be the echo time, and the at least one secondary signal dimension may include the coil unit and the repetition. In some embodiments, for at least one coil unit (i.e., for at least one value in the coil unit dimension) in each repetition (i.e., for at least one value in the repetition dimension), the processing device 120 may determine at least one preliminary value of the signal representation associated with the echo time along the first direction of the primary signal dimension.

Merely by way of example, the first direction may be a direction in which the echo time increases (i.e., the time elapses), for $Coil_1$ in $Repitition_1$, the processing device 120 may determine at least one preliminary value of a signal representation of the physical point $P_r$ based on the signals of $P_r$ corresponding to $Coil_1$ and $Repitition_1$, that is, $S_{e_1}^{1}(r)$ to $S_{e_n}^{1}(r)$ as illustrated in Table 1. The at least one preliminary value may include $\Delta S_{2-1}^{1}(r)$, $\Delta S_{3-2}^{1}(r)$, ......, and $\Delta S_{n-(n-1)}^{1}(r)$, wherein $\Delta S_{i-(i-1)}^{1}(r)$ refers to a change of signal intensity with respect to $Coil_1$ in $Repitition_1$ at $P_r$ over a time interval between $TE_i$ and $TE_{i-1}$ (i.e., as the echo time increases from $TE_{i-1}$ to $TE_i$). $\Delta S_{i-(i-1)}^{1}(r)$ may be determined based on $S_{e_i}^{1}(r)$ and $S_{e_{i-1}}^{1}(r)$. For example, $\Delta S_{i-(i-1)}^{1}(r)$ may be equal to $S_{e_i}^{1}(r)/S_{e_{i-1}}^{1}(r)$. Similarly, the processing device 120 may determine at least one preliminary value of the signal representation of the physical point $P_r$ for each of the other coil units in $Repitition_1$ and each coil unit in $Repitition_2$. In this way, $2m*(n-1)$ preliminary values of the signal representation of the physical point $P_r$ may be determined. In some embodiments, the processing device 120 may determine at least one preliminary value of the signal representation for a portion of the coil units and/or a portion of the repetitions. In this way, fewer than $2m*(n-1)$ preliminary values of the signal representation of $P_r$ may need to be determined.

It should be noted that the above description regarding the example in Table 1 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may determine one preliminary value of the signal representation (denoted as $\Delta S1$) for $Coil_1$ in $Repitition_1$. $\Delta S1$ may be equal to an average value of $\Delta S_{2-1}^{1}(r)$, $\Delta S_{3-2}^{1}(r)$, ......, and $\Delta S_{n-(n-1)}^{1}(r)$. Alternatively, the processing device 120 may determine $\Delta S_1^{1}$ by inputting $S_{e_1}^{1}(r)$ to $S_{e_n}^{1}(r)$ into an optimization function (e.g., Equation (7)) as described elsewhere in this disclosure (e.g., FIG. 6 and the relevant descriptions). In some embodiments, the at least one secondary signal dimension of the signals of the physical point $P_r$ described above is illustrative. The at least one secondary signal dimension of the signals of $P_r$ may include only one of the coil unit and repetition. Additionally or alternatively, the at least one secondary signal dimension of the signals of $P_r$ may further include one or more other secondary signal dimensions, such as one or more imaging parameters of the MRI device.

In 530, the processing device 120 (e.g., the determination module 304) may determine, based on at least a portion of the at least one preliminary value of the signal representation, the first value of the signal representation.

In some embodiments, the first value of the signal representation may be a sum, an average value, or a median value of the at least a portion of the at least one preliminary value of the signal representation. In some embodiments, all of the at least one preliminary value of the signal representation determined in operation 520 may be used to determine the first value of the signal representation of the subject. Alternatively, only a portion of the at least one preliminary value of the signal representation determined in operation 520 may be used to determine the first value of the signal representation of the subject. Taking the example illustrated in Table1 as an instance, the processing device 120 may determine the first value of the signal representation based on the preliminary values of the signal representation corresponding to $Coil_1$ to $Coil_{m-1}$, for example, if $Coil_m$ has some operation faults.

FIG. 6 is a flowchart illustrating an exemplary process 600 for determining a first value of a signal representation according to some embodiments of the present disclosure. In some embodiments, process 600 may be executed by the MRI system 100. For example, the process 600 may be implemented as a set of instructions (e.g., an application) stored in a storage device (e.g., the storage device 130). In some embodiments, the processing device 120 (e.g., one or more modules illustrated in FIG. 3) may execute the set of instructions and may accordingly be directed to perform the process 600. The operations of the illustrated process presented below are intended to be illustrative. In some embodiments, the process 600 may be accomplished with one or more additional operations not described and/or without one or more of the operations discussed. Additionally, the order of the operations of process 600 illustrated in FIG. 6 and described below is not intended to be limiting. In some embodiments, one or more operations of the process 600 may be performed to achieve at least part of operation 430 as described in connection with FIG. 4.

In 610, the processing device 120 (e.g., the determination module 304) may determine, among the plurality of signal dimensions, at least one secondary signal dimension.

In some embodiments, the operation 610 may be performed in a similar manner as the operation 510 of the process 500 as illustrated in FIG. 5.

In 620, the processing device 120 (e.g., the determination module 304) may obtain an optimization function of the signal representation, the optimization function incorporating the primary signal dimension along the first direction and the at least one secondary signal dimension.

For illustration purposes, it is assumed that the subject is a physical point of an object, the signal representation to be determined is $\Delta S1(r)$ (i.e., the change of signal intensity at the physical point with an echo time). As described above, the primary signal dimension associated with $\Delta S1(r)$ may be the echo time, and the at least one secondary signal dimension may include the coil unit. If the first direction is the direction in which the echo time increases, the optimization function may be an Equation (7) as below:

$$\operatorname{argmin}_{\Delta S1(r)_+} \sum_{i=1}^{N_e-1} \sum_{j=1}^{N_c} \|S_{i+1,j}(r) - S_{i,j}(r)\Delta S1(r)_+\|_2^2, \quad (7)$$

where $\Delta S1(r)_+$ denotes the first value of the signal representation along the direction in which the echo time increases (i.e., the degree of attenuation of signal intensity at the physical point $P_r$ of the patient as the echo time increases $\Delta TE$), i denotes a number of an echo, j denotes a number of a coil unit, $N_e$ refers the count of values in the echo time dimension, $N_c$ refers to the count of values in the coil unit, and $S_{i+1,j}(r)$ and $S_{i,j}(r)$ refer to a pair of signals corresponding to two successive echoes i and i+1 detected by one coil unit j.

If the first direction is the direction in which the echo time decreases, the optimization function may be an Equation (8) as below:

$$\operatorname{argmin}_{\Delta S1(r)_-} \sum_{i=1}^{N_e-1} \sum_{j=1}^{N_c} \|S_{i+1,j}(r)\Delta S1(r)_- - S_{i,j}(r)\|_2^2 \quad (8)$$

where $\Delta S1(r)_-$ denotes the first value of the signal representation along the direction in which the echo time decreases (i.e., the degree of enhancement of signal intensity at the physical point $P_r$ of the patient as the echo time decreases $\Delta TE$).

It should be noted that the Equations (7) and (8) illustrated above are merely provided for the purposes of illustration, and not intended to limit the scope of the present disclosure. In some embodiments, the signals of the physical point may have one or more other secondary signal dimensions, and the other secondary signal dimension(s) may be incorporated in the Equations (7) and (8), for example, in a similar manner as the coil unit.

In 630, the processing device 120 (e.g., the determination module 304) may determine the first value of the signal representation of the subject by inputting the plurality of signals into the optimization function.

The processing device 120 may input the signals corresponding to the physical point into Equation (7) (or Equation (8)) and solve Equation (7) (or Equation (8)) to determine $\Delta S1(r)$. For example, the determination of a value of the $\Delta S1(r)_+$ by solving the Equation (7) is described in Equation (9) as below:

$$\Delta S1(r)_+ = \frac{\sum_i^{N_e-1} \sum_j^{N_c} S_{i,j}(t)^* \cdot S_{i+1,j}(r)}{\sum_i^{N_e-1} \sum_j^{N_c} |S_{i,j}(r)|^2}, \quad (9)$$

The determination of a value of the $\Delta S1(r)_-$ by solving the Equation (8) is described in Equation (10) as below:

$$\Delta S1(r)_- = \frac{\sum_i^{N_e-1} \sum_j^{N_c} S_{i+1,j}(r)^* \cdot S_{i,j}(r)}{\sum_i^{N_e-1} \sum_j^{N_c} |S_{i+1,j}(r)|^2}, \quad (10)$$

In some embodiments, the processing device 120 may solve the optimization function using a least square method, a neural network model, a support vector machine (SVM), or the like, or any combination thereof.

In some embodiments, for at least one value in the at least one secondary signal dimension, the processing device 120 may determine at least one pair of signals corresponding to the value in the at least one secondary signal dimension among the plurality of signals. Each pair of the at least one pair of signals may correspond to different values in the primary signal dimension. For example, taking the physical point $P_r$ as an example, for $Coil_1$ in $Repitition_1$, the processing device 120 may determine (n−1) pairs of signals corresponding to successive echo signals detected by $Coil_1$ in $Repitition_1$, such as a first pair of $S_{e_1}^1(r)$ and $S_{e_2}^1(r)$, a second pair of $S_{e_2}^1(r)$ and $S_{e_3}^1(r)$, or the like.

Further, the processing device 120 may determine the first value of the signal representation of the subject by inputting the at least one pair of signals into the optimization function. For example, the at least one pair of signals may be inputted into Equation (7) (or Equation (8)) to determine $\Delta S1(r)$.

In the processes 500 and 600, the signal representation of the subject is determined by jointly processing signals of different signal dimensions, including the primary signal dimension and the at least one secondary signal dimension. This may improve the efficiency and/or accuracy of signal representation determination compared with processing signals of different signal dimensions independently. For example, in the process 500, one or more preliminary signal representations may be determined for each coil unit (i.e., for each value in a secondary signal dimension). The signal representation of the subject may be determined based on the preliminary signal representations of all coil units of the MRI device. For example, the signal representation of the subject may be an average of the preliminary signal representations of all coil units of the MRI device. In addition, in some embodiments, a preliminary value of the signal representation may be determined based on a comparison between signals detected by different coil units, for example, the preliminary value of the signal representation for $P_r$ may be equal to $S_{e_i}^1(r)/S_{e_{i-1}}^1(r)$ as described above. This may reduce the influence of coil performance (e.g., a sensitivity distribution, a signal-to-noise ratio (SNR)) on the signal representation, thereby improving the accuracy of the determined signal representation. As another example, in the process 600, an optimization function, which incorporates and processes both the primary signal dimension and the at least one secondary signal dimension, is utilized to determine the first value of the signal representation of the subject, which may improve computational efficiency and reduce processing time.

Figure 7:
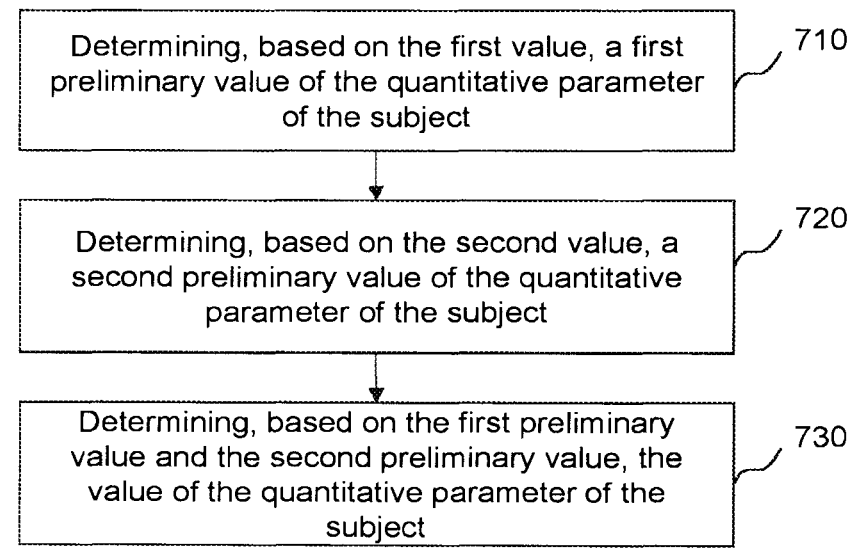
FIG. 7 is a flowchart illustrating an exemplary process 700 for determining a value of a quantitative parameter of a subject based on a first value and a second value according to some embodiments of the present disclosure.

FIG. 7 is a flowchart illustrating an exemplary process 700 for determining a value of a quantitative parameter of a subject based on a first value and a second value according to some embodiments of the present disclosure. In some embodiments, process 700 may be executed by the MRI system 100. For example, the process 700 may be implemented as a set of instructions (e.g., an application) stored in a storage device (e.g., the storage device 130). In some embodiments, the processing device 120 (e.g., one or more modules illustrated in FIG. 3) may execute the set of instructions and may accordingly be directed to perform the process 700. The operations of the illustrated process presented below are intended to be illustrative. In some embodiments, the process 700 may be accomplished with one or more additional operations not described and/or without one or more of the operations discussed. Additionally, the order of the operations of process 700 illustrated in FIG. 7 and described below is not intended to be limiting.

In some embodiments, one or more operations of the process 700 may be performed to achieve at least part of operation 440 as described in connection with FIG. 4.

In some embodiments, as described in elsewhere in the present disclosure, the signal representation and the primary signal dimension may be associated with the quantitative parameter. Each of the at least one secondary signal dimension may be not associated with the quantitative parameter.

For illustration purposes, the physical point $P_r$ of the patient described in FIG. 4 is described as an exemplary subject and a determination of exemplary quantitative parameters of $P_r$ is provided hereinafter. For example, the signal representation of $P_r$ may be $\Delta S1(r)$ and the quantitative parameter may include $T_2^*(r)$ and/or $\Delta B(r)$, wherein both $T_2^*(r)$ and $\Delta B(r)$ are associated with the echo time (i.e., the primary signal dimension with respect to $\Delta S1(r)$) according to Equation (1). As another example, the signal representation of $P_r$ may be $\Delta S2(r)$ and the quantitative parameter may be $T_2(r)$, wherein $T_2(r)$ is associated with the T2-preparation duration (i.e., the primary signal dimension with respect to $\Delta S2(r)$) according to Equation (3). As still another example, the signal representation of $P_r$ may be $\Delta S3(r)$ and the quantitative parameter may be $T_{1\rho}(r)$, wherein $T_{1\rho}(r)$ is associated with the T1ρ-preparation duration (i.e., the primary signal dimension with respect to $\Delta S3(r)$) according to Equation (4). As still another example, the signal representation of $P_r$ may be $\Delta S4(r)$ and the quantitative parameter may be $T1(r)$, wherein $T1(r)$ is associated with the inversion time (i.e., the primary signal dimension with respect to $\Delta S4(r)$) according to Equation (5). As still another example, the signal representation of $P_r$ may be $\Delta S5(r)$ and the quantitative parameter may be $ADC(r)$, wherein $ADC(r)$ is associated with the b-value (i.e., the primary signal dimension with respect to $\Delta S5(r)$) according to Equation (6).

In some embodiments, the signal representation of the subject may be a processing result in K-space. The quantitative parameter may be any parameter that is associated with the processing result in K-space. In some embodiments, the quantitative parameter may be data in K-space. Alternatively, the quantitative parameter may be data in the image domain, wherein the determination of the value of the quantitative parameter may be performed in image reconstruction. For instance, by way of determining one or more quantitative parameters in the image domain from signal representation(s) in K-space, image reconstruction is achieved.

In 710, the processing device 120 (e.g., the determination module 304) may determine, based on the first value, a first preliminary value of the quantitative parameter of the subject.

In some embodiments, the processing device 120 may obtain a first relationship relating to the signal representation and the quantitative parameter along the first direction of the primary signal dimension. The processing device 120 may determine the first preliminary value of the quantitative parameter of the subject based on the first value of the signal representation and the first relationship. For example, the first relationship may be described in the form of a correlation function, such as any of Equation (1) to Equation (6). The processing device 120 may determine the first preliminary value of the quantitative parameter by solving the correlation function. As another example, the first relationship may be presented in the form of a table or curve recording different signal representations and their corresponding first preliminary values of the quantitative parameter. The processing device 120 may determine the first preliminary value of the quantitative parameter by looking up the table or consulting the curve.

In some embodiments, the signal representation of the subject may be represented by a complex number including a phase component and an amplitude component. The first preliminary value of the quantitative parameter may be determined based on at least one of the phase component or the amplitude component of the complex number. Alternatively, the signal representation may be represented by a real number, and the first preliminary value of the quantitative parameter may be determined based on the real number. Taking the physical point $P_r$ as an example, if the first direction is the direction in which the echo time increases, and the first value of the signal representation is $\Delta S1(r)_+$ described above, a first preliminary value of $T_2^*(r)$ at $P_r$ (denoted as $T_{2+}^*(r)$) and/or a first preliminary value of $R_2^*(r)$ at $P_r$ (denoted as $R_{2+}^*(r)$) may be determined, wherein $R_2^*(r)$ refers to a transverse relaxation rate of $P_r$. Typically, it is considered that the values of $T_2^*(r)$ and $R_2^*(r)$ determined based on the value of the signal representation of the subject along a same direction of the primary signal dimension are reciprocals of each other, that is, $R_{2+}^*(r)$ and $T_{2+}^*(r)$ are reciprocals of each other, and $R_{2-}^*(r)$ and $T_{2-}^*(r)$ described in operation 720 are reciprocals of each other. If $\Delta S1(r)_+$ is a real number, $T_{2+}^*(r)$ and $R_{2+}^*(r)$ may be determined based on $\Delta S1(r)_+$. If $\Delta S1(r)_+$ is a complex number, $T_{2+}^*(r)$ and $R_{2+}^*(r)$ may be determined based on the amplitude component of $\Delta S1(r)_+$. For example, the determination of $T_{2+}^*(r)$ and $R_{2+}^*(r)$ based on $\Delta S1(r)_+$ is described in Equations (11) and (12) as below:

$$T_{2+}^*(r) = -\Delta TE/\ln(|\Delta S1(r)_+|), \quad (11)$$

and $$R_{2+}^*(r) = -\ln(|\Delta S1(r)_+|)/\Delta TE, \quad (12)$$

In 720, the processing device 120 (e.g., the determination module 304) may determine, based on the second value, a second preliminary value of the quantitative param.

In some embodiments, the processing device 120 may obtain a second relationship relating to the signal representation and the quantitative parameter along the second direction of the primary signal dimension. Further, the processing device 120 may determine the second preliminary value of the quantitative parameter of the subject based on the second value of the signal representation and the second relationship. In some embodiments, the determination of the second preliminary value of the quantitative parameter may be performed in a similar manner as that of the first preliminary value of the quantitative parameter. For example, taking the physical point $P_r$ as an example, if the second direction is the direction in which the echo time decreases, and the second value of the signal representation is $\Delta S1(r)_-$ described above, a second preliminary value of $T_2^*(r)$ at $P_r$ (denoted as $T_{2-}^*(r)$) and/or a second preliminary value of $R_2^*(r)$ at $P_r$ (denoted as $R_{2-}^*(r)$) may be determined. If $\Delta S1(r)_-$ is a real number, $T_{2-}^*(r)$ and $R_{2-}^*(r)$ may be determined based on $\Delta S1(r)_-$. If $\Delta S1(r)_-$ is a complex number, $T_{2-}^*(r)$ and $R_{2-}^*(r)$ may be determined based on the amplitude component of $\Delta S1(r)_-$. For example, the determination of $T_{2-}^*(r)$ and $R_{2-}^*(r)$ based on the $\Delta S1(r)_-$ is described in Equation (13) and Equation (14) as below:

$$T_{2-}^*(r) = \Delta TE/\ln(|\Delta S1(r)_-|), \quad (13)$$

and $$R_{2-}^*(r) = \ln(|\Delta S1(r)_-|)/\Delta TE, \quad (14)$$

In 730, the processing device 120 (e.g., the determination module 304) may determine, based on the first preliminary value and the second preliminary value, the value of the quantitative parameter of the subject.

Since one of the first preliminary value and the second preliminary value usually is smaller than the true value of the quantitative parameter, and the other of the first preliminary value and the second preliminary value usually is greater than the true value of the quantitative parameter, the defects of the first preliminary value and the second preliminary value may be made up for each other by combining the first preliminary value and the second preliminary value. Therefore, in some embodiments, the processing device 120 may determine the value of the quantitative parameter of the subject by combining the first preliminary value and the second preliminary value. In some embodiments, the quantitative parameter of the subject is the transverse relaxation rate $R_2^*(r)$, and the processing device 120 may designate an average of the first preliminary value $R_{2+}^*(r)$ and the second preliminary value $R_{2-}^*(r)$ as the value of the transverse relaxation rate $R_2^*(r)$. Merely by way of example, the value of $R_2^*(r)$ may be determined based on the $R_{2+}^*(r)$ and $R_{2-}^*(r)$ according to Equation (15) as below:

$$R_2^*(r) = \frac{R_{2+}^*(r) + R_{2-}^*(r)}{2}, \quad (15)$$

In some embodiments, the quantitative parameter of the subject is the transverse relaxation time $T_2^*(r)$, the processing device 120 may determine a first reciprocal of the first preliminary value $T_{2+}^*(r)$ and a second reciprocal of the second preliminary value $T_{2-}^*(r)$, and determine the value of the transverse relaxation time $T_2^*(r)$ based on the first reciprocal and the second reciprocal. Merely by way of example, the value of $T_2^*(r)$ may be determined based on the $T_{2+}^*(r)$ and $T_{2-}^*(r)$ according to Equation (16) as below:

$$T_2^*(r) = \left(\frac{\left|\frac{1}{T_{2+}^*(r)}\right| + \left|\frac{1}{T_{2-}^*(r)}\right|}{2}\right)^{-1}. \quad (16)$$

In some embodiments, a value of T2 may be determined in a similar manner as the determination of the value of the T2*, and a value of R2 may be determined in a similar manner as the determination of the value of the R2*.

Compared with the first preliminary value and the second preliminary value of the quantitative parameter, the value of the quantitative parameter determined by combining the first preliminary value and the second preliminary value may be closer to the actual value of the quantitative parameter and have a greater accuracy. In some embodiments, as the SNR decreases, the impact of noise on the first and second preliminary values become greater and greater, that is, a difference between the first preliminary value and the true value of the quantitative parameter and a difference between the second preliminary value and the true value of the quantitative parameter become larger and larger, the accuracy of the first and second preliminary values gradually decrease. According to some embodiments of the present disclosure, the value of the quantitative parameter determined by combining the first preliminary value and the second preliminary value may have a relatively high accuracy when the SNR is relatively low.

Figure 8A:
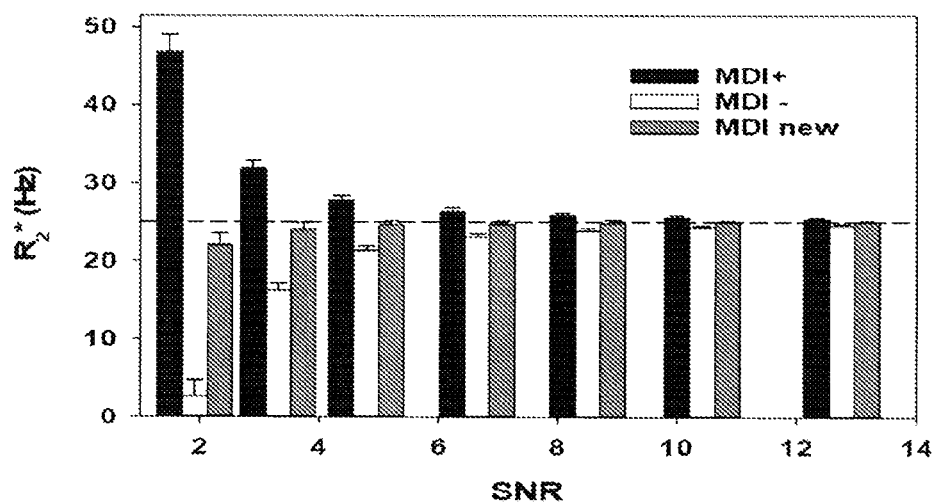
FIGS. 8A and 8B are schematic diagrams illustrating exemplary quantitative measurement results of R2 and T2 in an MR scan of a subject according to some embodiments of the present disclosure.
Figure 8B:
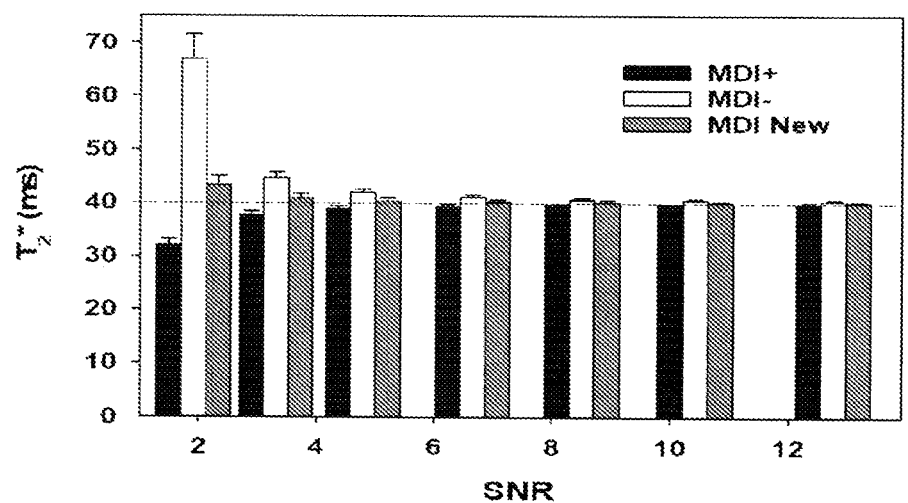

For example, FIGS. 8A and 8B are schematic diagrams illustrating exemplary quantitative measurement results of $R_2^*$ and $T_2^*$ in an MR scan of a subject according to some embodiments of the present disclosure. As shown in FIG. 8A, a true value of $R_2^*$ is 25 Hz. A first preliminary value MDI+ of $R_2^*$ gradually deviates from the true value and is greater than the true value as the SNR decreases. A second preliminary value MDI– of $R_2^*$ gradually deviates from the true value and is smaller than the true value as the SNR decreases. A value MDI new of $R_2^*$ acquired by performing the process 400 is substantially equal to the true value. It can be seen that an average (i.e., the value MDI new of $R_2^*$) of the first preliminary value MDI+ and the second preliminary value MDI– of $R_2^*$ is substantially equal to the true value since the defects of the first preliminary value MDI+ and the second preliminary value MDI– are made up to each other by combining the first preliminary value MDI+ and the second preliminary value MDI–. Therefore, compared with the first preliminary value MDI+ and the second preliminary value MDI–, the value MDI new of $R_2^*$ may have a greater accuracy, especially when the SNR is relatively low.

As shown in FIG. 8B, a true value of $T_2^*$ is 40 ms. A first preliminary value MDI+ of $T_2^*$ gradually deviates from the true value and is smaller than the true value as the SNR decreases. A second preliminary value MDI– of $T_2^*$ gradually deviates from the true value and is greater than the true value as the SNR decreases. A new value MDI new of $T_2^*$ acquired by performing the process 400 is substantially equal to the true value. It can be seen that the value MDI new of $T_2^*$ is substantially equal to the true value since the defects of the first preliminary value MDI+ and the second preliminary value MDI– are made up to each other by combining the first preliminary value MDI+ and the second preliminary value MDI–. Therefore, compared with the first preliminary value MDI+ and the second preliminary value MDI–, the value MDI new of $T_2^*$ may have a greater accuracy, especially when the SNR is relatively low.

As described elsewhere in the present disclosure, according to the conventional quantitative measurement approaches using the MDI technology, the value of the quantitative parameter of the subject is determined based on the value of the signal representation of the subject along only one direction of the primary signal dimension and has a limited accuracy. According to the some embodiments of the present disclosure, the value of the quantitative parameter of the subject may be determined based on the first value and the second value of the signal representation along the first direction and the second direction of the primary signal dimension, which may combines the first preliminary value and the second preliminary value to make up the defects of the first preliminary value and the second preliminary value, thereby improving the accuracy, stability, and reliability of determination of the value of the quantitative parameter.

EXAMPLES

Figure 9A:
FIGS. 9A-9C are schematic diagrams illustrating exemplary R2 maps 900A-900C of a brain of a patient according to some embodiments of the present disclosure.
Figure 9B:
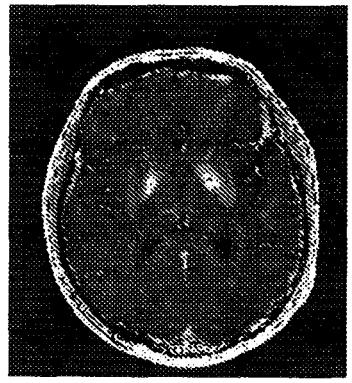
Figure 9C:
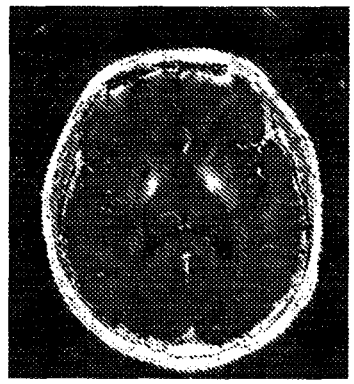

FIGS. 9A-9C are schematic diagrams illustrating exemplary $R_2^*$ maps 900A-900C of a brain of a patient according to some embodiments of the present disclosure.

As shown in FIGS. 9A-9C, each of the $R_2^*$ maps 900A-900C may include a plurality of pixels representing a plurality of physical points of the brain. In the $R_2^*$ map 900A, the pixel value corresponding to each physical point shows a first preliminary value of $R_2^*$ of the physical point, wherein the first preliminary value was determined by performing operation 710 disclosed in the present disclosure. In the $R_2^*$ map 900B, the pixel value corresponding to each physical point shows a second preliminary value of $R_2^*$ of the physical point, wherein the second preliminary value was determined by performing operation 720 disclosed in the present disclosure. In the $R_2^*$ map 900C, the pixel value corresponding to each physical point shows a value of $R_2^*$ determined by performing operation 730, that is, the pixel value corresponding to a physical point in 900C is an average of the first preliminary value of the physical point in the 900 A and the second preliminary value of the physical point in the 900B.

It can be seen that, compared with the $R_2^*$ maps 900A and 900B, the $R_2^*$ map 900C has less noise points, suggesting that the values of $R_2^*$ in the $R_2^*$ map 900C is more accurate than that in the $R_2^*$ maps 900A and 900B. In addition, since the background pixels in the $R_2^*$ maps are pure noise, the values of $R_2^*$ of the background pixels in the $R_2^*$ map 900A are extremely positive, so the $R_2^*$ map 900A has pure white background; the values of $R_2^*$ of the background pixels in the $R_2^*$ map 900B are extremely negative, so the $R_2^*$ map 900B has pure black background; the values of $R_2^*$ of the background pixels in the $R_2^*$ map 900C may be 0, which is consistent with the quantitative measurement result in FIG. 8A.

Figure 9D:
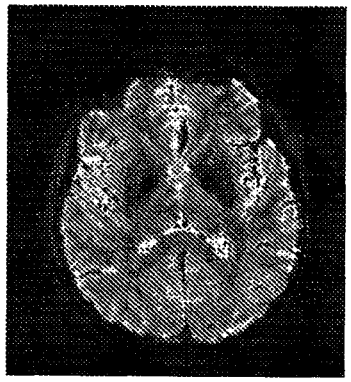
FIGS. 9D-9F are schematic diagrams illustrating exemplary T2 maps 900D-900F of a brain of a patient according to some embodiments of the present disclosure.
Figure 9E:
Figure 9F:
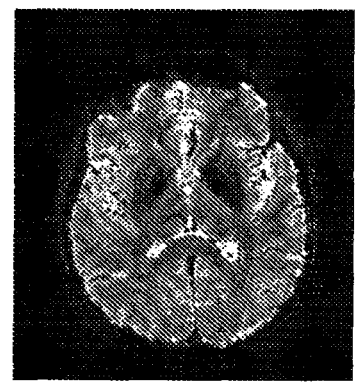

FIGS. 9D-9F are schematic diagrams illustrating exemplary $T_2^*$ maps 900D-900F of a brain of a patient according to some embodiments of the present disclosure.

As shown in FIGS. 9D-9F, each of the $T_2^*$ maps 900A-900C may include a plurality of pixels representing a plurality of physical points of the brain. In the $T_2^*$ map 900D, the pixel value corresponding to each physical point shows a first preliminary value of $T_2^*$ of the physical point, wherein the first preliminary value was determined by performing operation 710 disclosed in the present disclosure. In the $T_2^*$ map 900E, the pixel value corresponding to each physical point shows a second preliminary value of $T_2^*$ of the physical point, wherein the second preliminary value was determined by performing operation 720 disclosed in the present disclosure. In the $T_2^*$ map 900F, the pixel value corresponding to each physical point shows a value of $T_2^*$ determined by performing operation 730, that is, the pixel value corresponding to a physical point in 900F is a new value acquired by combining the first preliminary value of the physical point in the 900D and the second preliminary value of the physical point in the 900E.

It can be seen that, compared with the $T_2^*$ maps 900D and 900E, the $T_2^*$ map 900F has less noise points. For example, regions with a relatively great value of $T_2^*$ and the backgrounds in the $T_2^*$ maps 900D and 900E have more noise points than the $T_2^*$ map 900F. This suggests that the the $T_2^*$ map 900C is more accurate than the $T_2^*$ maps 900D and 900E.

Figure 10A:
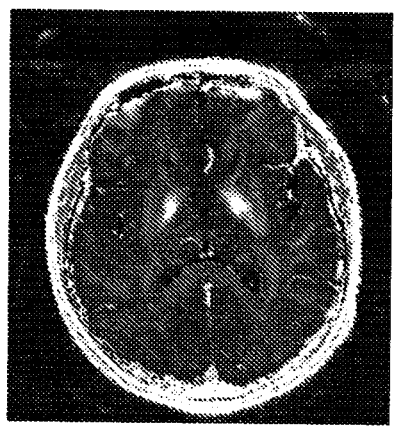
FIGS. 10A and 10B are schematic diagrams illustrating exemplary R2 maps 1000A and 1000B of a brain of a patient according to some embodiments of the present disclosure.
Figure 10B:
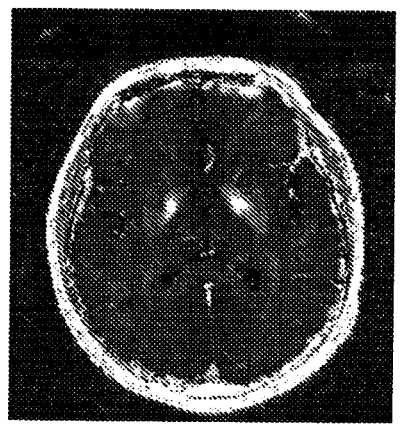

FIGS. 10A and 10B are schematic diagrams illustrating exemplary $R_2^*$ maps 1000A and 1000B of a brain of a patient according to some embodiments of the present disclosure.

As shown in FIGS. 10A and 10B, each $R_2^*$ map may include a plurality of pixels representing a plurality of physical points of the brain. The pixel value of each pixel in each $R_2^*$ map may be determined based on a calculated value of $R_2^*$ of the corresponding physical point. An MRI device was caused to apply a multi-echo pulse sequence on the brain of the patient, and a plurality of echoes sequentially occurred at different TEs. Each coil unit of the MRI device detected a plurality of echo signals corresponding to the echoes. For each coil unit, a plurality of images of the brain corresponding to the plurality of echoes were obtained by image reconstruction based on the corresponding echo signals. For the $R_2^*$ map 1000A, the images of different coil units corresponding to the same echo may be combined into an echo image, for example, using a sum of square (SOS) algorithm or an adaptive coil combination (ACC) algorithm. The pixel values of the pixels in the $R_2^*$ maps 1000A were determined based on the echo images corresponding to different echoes using a data fitting algorithm. The pixel values of the pixels in the $R_2^*$ map 1000B were determined by performing a method (e.g., the process 400) disclosed in the present disclosure.

As shown in FIGS. 10A and 10B, the $R_2^*$ maps 1000A and 1000B have different SNRs. For example, compared with the $R_2^*$ map 1000A, the $R_2^*$ map 1000B has fewer white dots and is more smooth, showing a higher SNR. This suggests that the method disclosed in the present disclosure can be used to generate $R_2^*$ maps with a higher image quality and a lower SNR.

Figure 10C:
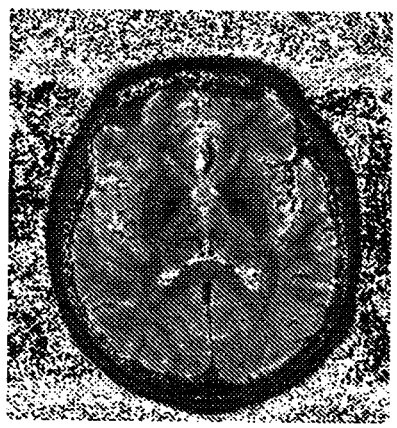
FIGS. 10C and 10D are schematic diagrams illustrating exemplary T2 maps 1000C and 1000D of a brain of a patient according to some embodiments of the present disclosure.
Figure 10D:
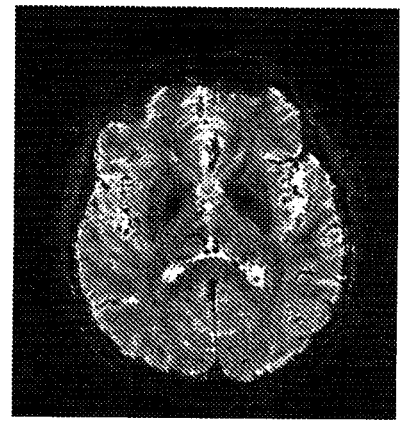

FIGS. 10C and 10D are schematic diagrams illustrating exemplary $T_2^*$ maps 1000C and 1000D of a brain of a patient according to some embodiments of the present disclosure.

As shown in FIGS. 10C and 10D, each $T_2^*$ map may include a plurality of pixels representing a plurality of physical points of the brain. The pixel value of each pixel in each $T_2^*$ map may be determined based on a calculated value of $T_2^*$ of the corresponding physical point. The $T_2^*$ map 1000C was generated in a similar manner as the generation of $R_2^*$ map 1000A. The $T_2^*$ map 1000D was generated in a similar manner as the generation of $R_2^*$ map 1000B. As shown in FIGS. 10C and 10D, the $T_2^*$ maps 1000C and 1000D have different SNRs. For example, compared with the $T_2^*$ map 1000C, the $T_2^*$ map 1000D has significantly fewer white dots and is more smooth, showing a higher SNR. This suggests that the method disclosed in the present disclosure can be used to generate a $T_2^*$ map with a higher image quality and a lower SNR.

It should be noted that the above examples illustrated in FIGS. 9A to 10D are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

It will be apparent to those skilled in the art that various changes and modifications can be made in the present disclosure without departing from the spirit and scope of the disclosure. In this manner, the present disclosure may be intended to include such modifications and variations if the modifications and variations of the present disclosure are within the scope of the appended claims and the equivalents thereof.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an subject oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (Saas).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate a certain variation (e.g., ±1%, ±5%, ±10%, or ±20%) of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques.

Notwithstanding that the numerical ranges and parameters setting forth the broad scope of some embodiments of the application are approximations, the numerical values set forth in the specific examples are reported as precisely as practicable. In some embodiments, a classification condition used in classification or determination is provided for illustration purposes and modified according to different situations. For example, a classification condition that "a value is greater than the threshold value" may further include or exclude a condition that "the probability value is equal to the threshold value."

What is claimed is:

1. A magnetic resonance imaging (MRI) system, comprising:
   at least one storage device including a set of instructions for quantitative measurement in MRI; and
   at least one processor in communication with the at least one storage device, wherein when executing the set of instructions, the at least one processor is configured to direct the system to perform operations including:
   acquiring a plurality of signals of the subject, the plurality of signals being generated using an MRI device, each of the plurality of signals corresponding to a set of values in a plurality of signal dimensions of signal acquisition using the MRI device;
   determining, among the plurality of signal dimensions, a primary signal dimension associated with a signal representation of the subject;
   determining a first value and a second value relating to the signal representation of the subject based on the plurality of signals, wherein the first value represents the signal representation along a first direction of the primary signal dimension, the second value represents the signal representation along a second direction of the primary signal dimension, and the first direction is opposite to the second direction; and
   determining a value of a quantitative parameter of the subject based on the first value and the second value(,)
   wherein the determining a value of a quantitative parameter of the subject based on the first value and the second value includes: determining, based on the first value, a first preliminary value of the quantitative parameter of the subject; determining, based on the second value, a second preliminary value of the quantitative parameter of the subject; and determining, based on the first preliminary value and the second preliminary value, the value of the quantitative parameter of the subject.

2. The system of claim 1, wherein if the primary signal dimension is an echo time, the first direction is a direction in which the time elapses, and the second direction is a direction in which the time retrogrades.

3. The system of claim 1, wherein the determining, based on the first value, a first preliminary value of the quantitative parameter of the subject: obtaining a first relationship relating to the signal representation and the quantitative parameter along the first direction of the primary signal dimension; and determining, based on the first value of the signal representation and the first relationship, the first preliminary value of the quantitative parameter of the subject.

4. The system of claim 1, wherein the determining, based on the second value, a second preliminary value of the quantitative parameter of the subject: obtaining a second relationship relating to the signal representation and the quantitative parameter along the second direction of the primary signal dimension; and determining, based on the second value of the signal representation and the second relationship, the second preliminary value of the quantitative parameter of the subject.

5. The system of claim 1, wherein the quantitative parameter of the subject is a transverse relaxation time, and the determining, based on the first preliminary value and the second preliminary value, the value of the quantitative parameter of the subject includes: determining, a first reciprocal of the first preliminary value and a second reciprocal of the second preliminary value; and determining, based on the first reciprocal and the second reciprocal, the value of the transverse relaxation time.

6. The system of claim 1, wherein the quantitative parameter of the subject is a transverse relaxation rate, and the determining, based on the first preliminary value and the second preliminary value, the value of the quantitative parameter of the subject includes: designating an average of the first preliminary value and the second preliminary value as the value of the transverse relaxation rate.

7. The system of claim 1, wherein the operations further include:
   determining, based on the first value and the second value, a value of a signal-noise parameter indicative of a signal level of the plurality of signals relative to a noise level of the plurality of signals.

8. The system of claim 1, wherein the subject is one of a plurality of physical points of an object, and the operations further include:

generating, based on a value of the quantitative parameter of each physical point of the object, a parametric map relating to the quantitative parameter of the object;

for each of at least one reference signal representation, determining a value of a first signal-noise parameter indicative of a signal level of the reference signal representation relative to a noise level of the reference signal representation; and determining, based on the value of the first signal-noise parameter of each reference signal representation, a value of a second signal-noise parameter indicative of a signal level of the parametric map relative to a noise level of the parametric map.

9. The system of claim 1, wherein the first value of the signal representation of the subject is determined by:

determining, among the plurality of signal dimensions, at least one secondary signal dimension;

for each of at least one value in the at least one secondary signal dimension, determining, based on a portion of the plurality of signals that correspond to the value of the at least one secondary signal dimension, at least one preliminary value of the signal representation along the first direction of the primary signal dimension; and determining, based on at least a portion of the at least one preliminary value of the signal representation, the first value of the signal representation.

10. The system of claim 1, wherein the first value of the signal representation of the subject is determined by:

determining, among the plurality of signal dimensions, at least one secondary signal dimension;

obtaining an optimization function of the signal representation, the optimization function incorporating the primary signal dimension along the first direction and the at least one secondary signal dimension; and determining the first value of the signal representation of the subject by inputting the plurality of signals into the optimization function.

11. The system of claim 10, wherein the determining the first value of the signal representation of the subject by inputting the plurality of signals into the optimization function includes:

for at least one value in the at least one secondary signal dimension, determining, among the plurality of signals, at least one pair of signals corresponding to the value in the at least one secondary signal dimension, wherein each pair of the at least one pair of signals corresponds to different values in the primary signal dimension; and determining the first value of the signal representation of the subject by inputting the at least one pair of signals into the optimization function.

12. The system of claim 1, wherein the acquiring a plurality of signals of the subject includes:

causing the MRI device to apply an MR pulse sequence on the subject;

detecting, by at least one coil units of the MRI device, a plurality of echo signals; and determining, based on the plurality of echo signals, the plurality of signals of the subject.

13. The system of claim 12, wherein the subject is a physical point of an object, and the determining, based on the plurality of echo signals, the plurality of signals of the subject includes:

reconstructing, based on the plurality of echo signals, a plurality of images including image data of the physical point; and designating the image data corresponding to the physical point in the plurality of images as the plurality of signals of the physical point.

14. The system of claim 1, wherein the subject is a physical point of an object, the signal representation is a change of signal intensity at the physical point with an echo time, and the quantitative parameter of the physical point includes at least one of a longitudinal relaxation time, a transverse relaxation time, a transverse relaxation rate, an apparent diffusion coefficient (ADC), a field distribution, a signal-noise ratio indicator, or a signal-signal ratio indicator.

15. The system of claim 14, wherein:

the primary signal dimension is an echo time, and the quantitative parameter is at least one of the transverse relaxation time, or the field distribution, or the primary signal dimension is a T2-preparation duration, and the quantitative parameter is the transverse relaxation time, or the primary signal dimension is an inversion time, and the quantitative parameter is the longitudinal relaxation time, or the primary signal dimension is a b-value, and the quantitative parameter is the ADC.

16. The system of claim 1, wherein:

the signal representation is represented by a complex number including a phase component and an amplitude component, and the value of the quantitative parameter is determined based on at least one of the phase component or the amplitude component of the complex number, or the signal representation is represented by a real number, and the value of the quantitative parameter is determined based on the real number.

17. The system of claim 1, wherein the plurality of signal dimensions include at least two of an echo time (TE), an unit repetition time (TR), an inversion recovery time (TI), a b-value, a T1 p-preparation duration, a T2-preparation duration, a repetition, a velocity encoding value, a count of radio frequency (RF) channels, a flip angle, an RF center frequency, or a RF receiving coil unit.

18. A magnetic resonance imaging (MRI) method, the method being implemented on a computing device having at least one storage device and at least one processor, the method comprising:

acquiring a plurality of signals of the subject, the plurality of signals being generated using an MRI device, each of the plurality of signals corresponding to a set of values in a plurality of signal dimensions of signal acquisition using the MRI device;

determining, among the plurality of signal dimensions, a primary signal dimension associated with a signal representation of the subject;

determining a first value and a second value relating to the signal representation of the subject based on the plurality of signals, wherein the first value represents the signal representation along a first direction of the primary signal dimension, the second value represents the signal representation along a second direction of the primary signal dimension, and the first direction is opposite to the second direction; and determining a value of a quantitative parameter of the subject based on the first value and the second value(,) wherein the determining a value of a quantitative parameter of the subject based on the first value and the second value includes: determining, based on the first value, a first preliminary value of the quantitative parameter of the subject; determining, based on the second value, a second preliminary value of the quantitative parameter of the subject; and determining, based on the first preliminary value and the second preliminary value, the value of the quantitative parameter of the subject.

19. A non-transitory computer readable medium, comprising at least one set of instructions for magnetic resonance imaging (MRI), wherein when executed by one or more processors of a computing device, the at least one set of instructions causes the computing device to perform a method, the method comprising:

acquiring a plurality of signals of the subject, the plurality of signals being generated using an MRI device, each of the plurality of signals corresponding to a set of values in a plurality of signal dimensions of signal acquisition using the MRI device;

determining, among the plurality of signal dimensions, a primary signal dimension associated with a signal representation of the subject;

determining a first value and a second value relating to the signal representation of the subject based on the plurality of signals, wherein the first value represents the signal representation along a first direction of the primary signal dimension, the second value represents the signal representation along a second direction of the primary signal dimension, and the first direction is opposite to the second direction; and determining a value of a quantitative parameter of the subject based on the first value and the second value(,) wherein the determining a value of a quantitative parameter of the subject based on the first value and the second value includes: determining, based on the first value, a first preliminary value of the quantitative parameter of the subject; determining, based on the second value, a second preliminary value of the quantitative parameter of the subject; and determining, based on the first preliminary value and the second preliminary value, the value of the quantitative parameter of the subject.

* * * * *